United States Patent
Ireland et al.

(10) Patent No.: US 7,058,876 B1
(45) Date of Patent: Jun. 6, 2006

(54) METHOD AND APPARATUS FOR USE IN A DECODER OF A FORWARD ERROR CORRECTION (FEC) SYSTEM FOR LOCATING BIT ERRORS IN A ERROR LOCATOR POLYNOMIAL

(75) Inventors: Howard H. Ireland, Woodstock, GA (US); Jeffery T. Nichols, Marietta, GA (US)

(73) Assignee: CIENA Corporation, Linthicum, MD (US)

( * ) Notice: Subject to any disclaimer, the term of this patent is extended or adjusted under 35 U.S.C. 154(b) by 599 days.

(21) Appl. No.: 10/371,708

(22) Filed: Feb. 22, 2003

Related U.S. Application Data

(60) Provisional application No. 60/359,274, filed on Feb. 21, 2002.

(51) Int. Cl.
  *H03M 13/15* (2006.01)
(52) U.S. Cl. .................................................. 714/781
(58) Field of Classification Search ........ 714/781–782; H03M 13/05
  See application file for complete search history.

(56) References Cited

U.S. PATENT DOCUMENTS

| | | | | |
|---|---|---|---|---|
| 6,374,383 | B1 * | 4/2002 | Weng ........................... | 714/781 |
| 6,421,807 | B1 * | 7/2002 | Nakamura et al. ........... | 714/781 |
| 2005/0210353 | A1 * | 9/2005 | Dohmen et al. ............. | 714/746 |

FOREIGN PATENT DOCUMENTS

| EP | 1102406 A2 * | 5/2001 |
|---|---|---|
| EP | 1217750 A2 * | 6/2002 |

OTHER PUBLICATIONS

Blanz, E et al.; Key Equation Solver for Variable Block Reed-Solomon Decoder; IBM TDB v38 n6 Jun. 1995 p 111-112, Jun. 1, 1995.*

* cited by examiner

*Primary Examiner*—R. Stephen Dildine
(74) *Attorney, Agent, or Firm*—Dougherty Clements; Christopher L. Bernard; Tyler S. Brown

(57) ABSTRACT

The present invention provides a method and apparatus for quickly and efficiently processing an error correction polynomial to locate bit errors using a Chien search algorithm. In accordance with the present invention, it has been determined that multiplying the Λ coefficients of the error locator polynomial by a scaling vector prior to performing the Chien search algorithm matrix operations, it possible to use constant coefficients in the matrix multiply logic. This enables a relatively small amount of logic to be used to perform the matrix multiplication operations of the Chien search algorithm. The Chien search algorithm logic of the present invention is configured to perform many matrix multiply operations in parallel, which enables the Chien search algorithm to be executed very quickly to locate the bit errors in the error locator polynomial. Such a large number of matrix multiply operations would normally require a very large number of gates. However, the constant coefficient matrix multiply logic configuration of the present invention that is made possible by the aforementioned scaling significantly limits the amount of logic needed to perform the matrix multiply operations. Therefore, the present invention enables very high-speed throughput with respect to error correction, and does so using a relatively small amount of logic. This renders the decoder of the present invention suitable for use in high data rate systems. Furthermore, the use of a relatively small amount of logic limits area and power consumption requirements.

20 Claims, 25 Drawing Sheets

$$\begin{bmatrix} S_1 \\ S_3 \\ S_5 \\ S_7 \\ \vdots \\ S_{75} \\ S_{77} \end{bmatrix} = \begin{bmatrix} 1 & \alpha^1 & \alpha^2 & \alpha^3 & \alpha^4 & \alpha^5 & \alpha^6 & \alpha^7 & \alpha^8 & \alpha^9 & \cdots & \alpha^{7677} & \alpha^{7678} & \alpha^{7679} \\ 1 & \alpha^3 & \alpha^6 & \alpha^9 & \alpha^{12} & \alpha^{15} & \alpha^{18} & \alpha^{21} & \alpha^{24} & \alpha^{27} & \cdots & \alpha^{6649} & \alpha^{6652} & \alpha^{6655} \\ 1 & \alpha^5 & \alpha^{10} & \alpha^{15} & \alpha^{20} & \alpha^{25} & \alpha^{30} & \alpha^{35} & \alpha^{40} & \alpha^{45} & \cdots & \alpha^{5621} & \alpha^{5626} & \alpha^{5631} \\ 1 & \alpha^7 & \alpha^{14} & \alpha^{21} & \alpha^{28} & \alpha^{35} & \alpha^{42} & \alpha^{49} & \alpha^{56} & \alpha^{63} & \cdots & \alpha^{4593} & \alpha^{4600} & \alpha^{4607} \\ & & & & & \vdots & & & & & & & & \\ 1 & \alpha^{75} & \alpha^{150} & \alpha^{225} & \alpha^{300} & \alpha^{375} & \alpha^{450} & \alpha^{525} & \alpha^{600} & \alpha^{675} & \cdots & \alpha^{2405} & \alpha^{2480} & \alpha^{2555} \\ 1 & \alpha^{77} & \alpha^{154} & \alpha^{231} & \alpha^{308} & \alpha^{385} & \alpha^{462} & \alpha^{539} & \alpha^{616} & \alpha^{693} & \cdots & \alpha^{1377} & \alpha^{1454} & \alpha^{1531} \end{bmatrix} \begin{bmatrix} r_0 \\ r_1 \\ r_2 \\ r_3 \\ r_4 \\ r_5 \\ \vdots \\ r_{7678} \\ r_{7679} \end{bmatrix}$$

$$\begin{bmatrix} S_1[n] \\ S_3[n] \\ S_5[n] \\ S_7[n] \\ \vdots \\ S_{75}[n] \\ S_{77}[n] \end{bmatrix} = \begin{bmatrix} 1 & \alpha^1 & \alpha^2 & \alpha^3 & \alpha^4 & \alpha^5 & \alpha^6 & \cdots & \alpha^{29} & \alpha^{30} & \alpha^{31} \\ 1 & \alpha^3 & \alpha^6 & \alpha^9 & \alpha^{12} & \alpha^{15} & \alpha^{18} & \cdots & \alpha^{87} & \alpha^{90} & \alpha^{93} \\ 1 & \alpha^5 & \alpha^{10} & \alpha^{15} & \alpha^{20} & \alpha^{25} & \alpha^{30} & \cdots & \alpha^{145} & \alpha^{150} & \alpha^{155} \\ 1 & \alpha^7 & \alpha^{14} & \alpha^{21} & \alpha^{28} & \alpha^{35} & \alpha^{42} & \cdots & \alpha^{203} & \alpha^{210} & \alpha^{217} \\ & & & \vdots & & & & & & \vdots & \\ 1 & \alpha^{75} & \alpha^{150} & \alpha^{225} & \alpha^{300} & \alpha^{375} & \alpha^{450} & \cdots & \alpha^{2175} & \alpha^{2250} & \alpha^{2325} \\ 1 & \alpha^{77} & \alpha^{154} & \alpha^{231} & \alpha^{308} & \alpha^{385} & \alpha^{462} & \cdots & \alpha^{2233} & \alpha^{2310} & \alpha^{2387} \end{bmatrix} \begin{bmatrix} r_{32*n+0} \\ r_{32*n+1} \\ r_{32*n+2} \\ r_{32*n+3} \\ \vdots \\ r_{32*n+30} \\ r_{32*n+31} \end{bmatrix} + \begin{bmatrix} \alpha^{32} \cdot S_1[n-1] \\ \alpha^{96} \cdot S_3[n-1] \\ \alpha^{160} \cdot S_5[n-1] \\ \alpha^{224} \cdot S_7[n-1] \\ \vdots \\ \alpha^{2400} \cdot S_{75}[n-1] \\ \alpha^{2464} \cdot S_{77}[n-1] \end{bmatrix}$$

BIT 0 COMPUTATION LOGIC

BIT 1 COMPUTATION LOGIC

BIT 2 COMPUTATION LOGIC

BIT 5 COMPUTATION LOGIC

BIT 6 COMPUTATION LOGIC

BIT 7 COMPUTATION LOGIC

METHOD AND APPARATUS FOR USE IN A DECODER OF A FORWARD ERROR CORRECTION (FEC) SYSTEM FOR LOCATING BIT ERRORS IN A ERROR LOCATOR POLYNOMIAL

CROSS-REFERENCE TO RELATED APPLICATIONS

This application claims priority to a provisional application that was filed on Feb. 21, 2002, entitled OC-192 Forward Error Correction and Sonet Transport Overhead ASIC Functional Specification, having Ser. No. 60/359,274, which is incorporated by reference herein in its entirety.

TECHNICAL FIELD OF THE INVENTION

The present invention relates to communications and, more particularly, to a method and apparatus for quickly and efficiently locating errors an error locator polynomial produced by Berlekamp algorithm logic in a decoder of a Forward error correction (FEC) system.

BACKGROUND OF THE INVENTION

When information is transmitted over a communications link between a receiver and a transmitter, the bits that describe the information being transmitted can be corrupted. In other words, the receiver may determine that a received bit that is supposed to be a binary 1 is a binary 0, and vice versa. Corruption of bits in a data stream may be caused by a variety of factors or components in the communications link. For example, in an optical fiber network, optical energy is transmitted in the form of optical pulses that have particular levels that correspond to binary 1s and 0s. If the level of the optical energy is too low, the receiver can have difficulty determining whether a pulse corresponds to a binary 1 or a binary 0. Repeaters, or amplifiers, normally are disposed at particular locations along the communications link that amplify the optical signals so that they are at the proper levels to enable the receiver to determine whether it has received a binary 1 or a binary 0. Typically, the optical signals are converted into electrical signals at the repeaters. The electrical signals are then amplified and converted into optical signals, which are then modulated back onto the optical fiber. Similarly, at the receiver, the optical signals typically are converted back into electrical signals, which the receiver compares to a threshold value to determine whether it has received a binary 1 or a binary 0.

Because it is possible for the bits to be corrupted, techniques have been developed and implemented that provide error correction. In other words, if a bit received by the receiver is erroneously determined to be a binary 1 when it was meant to be a binary 0 when it was transmitted, and vice versa, receivers utilize various techniques to determine whether a bit value has been incorrectly identified and to correct the bit value. One known technique used for such purposes is generally referred to as the "Automatic Repeat Request" (ARQ) technique. In accordance with this technique, when the receiver detects a bit error, it sends a signal to the transmitter that tells the transmitter to retransmit the block of data that contained the error. The receiver processes the retransmitted data block and detects bit errors. The data block may need to be retransmitted several times before the receiver determines that the data is without error. Of course, retransmitting data utilizes bandwidth and generally slows down the overall throughput of the communications system.

A technique known as Forward Error Correction (FEC) is commonly used in the communications industry to reduce errors in data being transmitted over a communications link without requiring retransmission of data. FEC not only detects bit errors, but corrects detected bit errors. One of the primary advantages of FEC over ARQ is that no retransmission of data is required with FEC. This is because FEC techniques introduce redundancy in the data bits that enables the receiver of a communications system to detect errors in data being transmitted and to correct the detected errors. The redundancy generally is introduced by utilizing data bits from the data stream to encode the data stream. The receiver has a decoder that has intelligence with regard to the encoding scheme used by the transmitter, which enables the receiver to decode the data and detect and correct errors without the need for retransmission. Another advantage of FEC is that, because it does not require retransmission of data, simplex links can be used, which is desirable in certain situations, such as when the receivers are receive-only terminals.

Generally, FEC techniques and systems fall into two broad categories, namely, block coding and convolution coding. Various block coding and convolution coding techniques are currently in use in the communications industry. In the past, the use of block codes has generally been limited to use in communications systems that have relatively low data rates for various reasons, such as the aforementioned adverse effects on overall coding gain (signal-to-noise ratio, $E_b/N_o$), which is expressed in decibels (dB), for short data bursts and the reduced overall throughput that can result from the synchronization requirement. Convolution coding has generally been the preferred FEC technique for high data rate implementations. However, convolution coding results in higher output bit error rates (BER) than the output (BERs) that can be achieved using block coding. Some customers want FEC systems with very low BERs (e.g., $10^{-15}$), which generally cannot be achieved using convolution coding, but which can be achieved using block coding, such as Bose-Chaudhuri-Hocquenghem (BCH) block coding, for example.

FEC decoding requires that a vector known as the syndrome vector be computed by multiplying the code word received by the decoder of the FEC system receiver by a matrix known as the parity-check matrix. This syndrome vector is then processed in accordance with a Berlekamp algorithm, which generates an error location polynomial. The error correction polynomial, once resolved, is analyzed in accordance with a Chien search algorithm, which determines the actual locations of the bit errors in the received code word. The Chien search engine then passes results to an error correction logic block which exclusive-ORs (XORs) the output from the Chien search engine with delayed corresponding bits of the code word, which causes the bits that are erroneous to be inverted and thereby corrected.

Generally, the Chien search algorithm finds the 0s in the error locator polynomial X by evaluating the polynomial at all possible values of X and flagging all values that result in a zero output. The Chien search algorithms commonly employed in decoders utilize a large matrix having values that are multiplied by the coefficients of the error locator polynomial. After the matrix multiplication operations have been performed, the Chien search algorithm checks the results of the operations for 0s. Because the matrix that is multiplied by the error locator polynomial coefficients is very large, a large number of logical operations would need to be performed, which would require a large number of logic gates. The large number of logic gates would consume a large area on the decoder integrated circuit (IC) and would also consume a large amount of power.

In order to avoid using such a large number of logic gates, the typical Chien algorithm uses a shift register approach, which requires a very small amount of logic, but which can only process one bit per cycle. This approach generally is suitable for low data rate systems, but in order for such an approach to be used in a high data rate system, the system would have to operate at a prohibitively fast clock speed. Consequently, the commonly used Chien search algorithms are not suitable for use in high data rate communications systems.

A need exists for a method and apparatus for performing the Chien search algorithm quickly with a relatively small amount of logic so that a large amount of area from being required for implementation of the algorithm logic, power consumption is kept relatively low and the decoder can be used in high data rate systems.

SUMMARY OF THE INVENTION

The present invention provides a method and apparatus for quickly and efficiently processing an error correction polynomial to locate bit errors using a Chien search algorithm. In accordance with the present invention, it has been determined that multiplying the $\Lambda$ coefficients of the error locator polynomial by a scaling vector prior to performing the Chien search algorithm matrix operations, it is possible to use constant coefficients in the matrix multiply logic. This enables a relatively small amount of logic to be used to perform the matrix multiplication operations of the Chien search algorithm. The Chien search algorithm logic of the present invention is configured to perform many matrix multiply operations in parallel, which enables the Chien search algorithm to be executed very quickly to locate the bit errors in the error locator polynomial. Such a large number of matrix multiply operations would normally require a very large number of gates. However, the constant coefficient matrix multiply logic configuration of the present invention that is made possible by the aforementioned scaling significantly limits the amount of logic needed to perform the matrix multiply operations.

Therefore, it can be seen that the present invention enables very high-speed throughput with respect to error correction, and does so using a relatively small amount of logic. This renders the decoder of the present invention suitable for use in high data rate systems. Furthermore, the use of a relatively small amount of logic limits area and power consumption requirements.

These and other features and advantages of the present invention will become apparent from the following description, drawings and claims.

BRIEF DESCRIPTION OF THE DRAWINGS

FIG. 2 mathematically illustrates the known technique of computing the syndrome vector using a full parity-check matrix.

FIG. 3 mathematically illustrates computation of the syndrome vector in accordance with the preferred embodiment of the present invention by using a partial parity-check matrix in conjunction with a recursive computation algorithm.

DETAILED DESCRIPTION OF THE PREFERRED EMBODIMENT OF THE INVENTION

Figure 1:
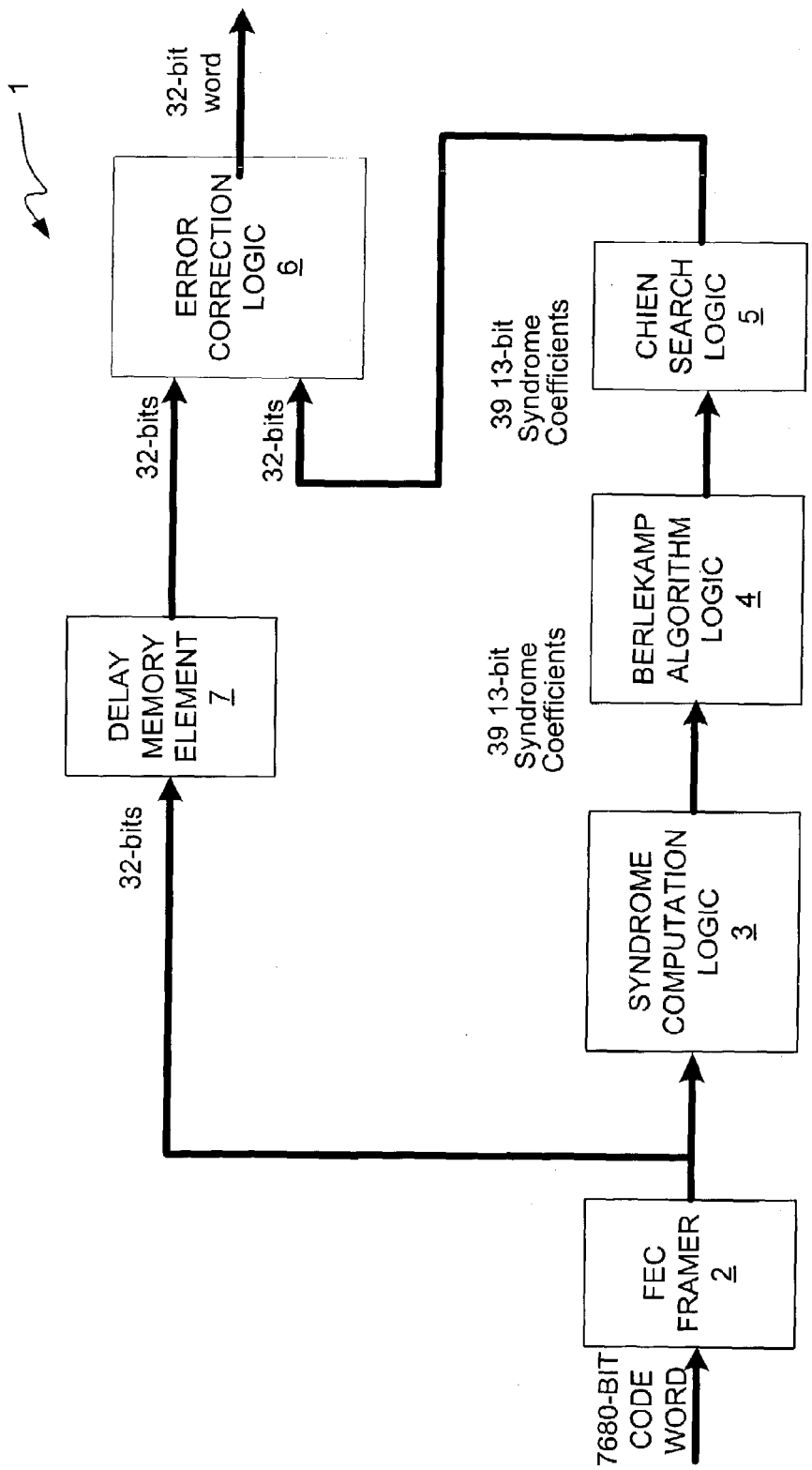
FIG. 1 is a block diagram of the decoder of the present invention in accordance with the preferred embodiment.

FIG. 1 is a block diagram of the (FEC) decoder of the present invention in accordance with an example embodiment. In accordance with the example embodiment, the FEC decoder uses BCH block coding with a code word length of n=7680 bits, of which k=7173 bits correspond to the message word and l=507 bits correspond to the length of the parity vector. Each 7680-bit message word is subdivided into 240 32-bit words. The lengths of the 240 words that will be processed will be referred to herein as i, so i is 32 in this example embodiment.

The FEC code in accordance with the example embodiment of the present invention has an error correction capability of 39 errors per non-interleaved block, and 156 errors with 4 way bit-interleaving (not shown). For ease of explanation and illustration, a single block of syndrome computation logic is shown and described herein (i.e., block interleaving is not illustrated) for producing the syndrome vector that the Berlekamp algorithm logic block utilizes to generate the error locator polynomial in accordance with the present invention. Therefore, the error correction capability of the decoder described in the example embodiment of the present invention is 39. However, the present invention is not limited with respect to error correction (i.e., parity vector length), code word length, message word length, the number of interleaving selections, etc. Those skilled in the art will understand that such variables are chosen based on a selected implementation. Also, the present invention is not limited to any particular type of block coding, but in the preferred embodiments described herein, BCH block coding is used. However, those skilled in the art will understand, in view of the description provided herein, that the present invention is equally applicable to all types of block coding, and that the present invention is being with reference only to BCH coding for purposes of brevity.

With reference again to FIG. 1, the decoder 1 comprises an FEC framer 2, a syndrome computation logic block 3, the Berlekamp algorithm logic block 4 of the present invention, a Chien search logic block 5, an error correction logic block 6 and a delay memory element 7. Because typical FEC decoders generally utilize various configurations for all of these logic blocks, most of these blocks will only be generally described. The focus of the present invention is on the Berlekamp algorithm logic block 4, so it will be described in detail. In addition, because the Berlekamp logic block 4 receives and processes the syndrome vectors output from the syndrome computation logic block 3, the configuration of the syndrome computation logic block 3 will also be described in detail. Also, because the syndrome computation logic block generates the input to the Berlekamp algorithm logic block 4, the description of the syndrome computation logic block 3 will be provided before the description of the Berlekamp algorithm logic block 4 of the present invention.

The FEC framer 2 analyzes the incoming data to find a pattern that indicates where each code word begins and ends. As stated above, the code word used in the example embodiment described herein is 7680 bits in width and contains 240 32-bit words. The syndrome computation logic 12 in accordance with this example embodiment processed one 32-bit word at a time, and by the end of 240 cycles, outputs a resolved syndrome vector having 39 13-bit syndrome coefficients. The manner which the syndrome computation logic block produces the syndrome vectors in accordance with the preferred embodiment will be described in detail below with reference to FIGS. 2–4.

The Berlekamp algorithm logic block 4 of the present invention generates the error location polynomial. The 0s in this polynomial correspond to the locations where symbol errors have occurred. The manner in which the Berlekamp algorithm logic 4 of the present invention generates the error location polynomial will be described below in detail with reference to FIGS. 5–8. The Chien search logic block 5 then operates on the error location polynomial generated by the Berlekamp algorithm logic block 4 to determine the locations of the 0 coefficients in the error location polynomial. The output of the Chien search logic block 5 is, in accordance with the example embodiment, a 32-bit word, which, when exclusive-ORed (XORed) by the error correction logic 6 with the corresponding 32 bits from the code word, which have been delayed by an appropriate amount of time by delay memory element 7, generates an error-free 32-bit word.

The manner in which the syndrome vectors are calculated by the syndrome computation logic 3 in accordance with the preferred embodiment will now be described with reference to FIGS. 2–4. The syndrome computation logic block 3 in accordance with the preferred embodiment recursively utilizes a partial parity-check matrix to generate the syndrome vector. As will become apparent from the following description, this recursive use of a partial parity-check matrix enables the syndrome computations to be performed very quickly so that the decoder is suitable for use in high data rate systems and provides a very large reduction in the amount of logic needed to perform the syndrome vector computations.

FIG. 2 mathematically illustrates, using the example variables (e.g., code word width, error correction capability, etc.) given above, a known technique of computing a syndrome vector $S_1$, $S_3$, $S_5$ . . . $S_{77}$, designated by the reference numeral 8, by multiplication of the received code word $r_0$, $r_1$, $r_2$, $r_3$ . . . $r_{7679}$, designated by the reference numeral 9, by a full parity-check matrix 10. It should be noted that the syndrome vector 8 includes only odd Syndrome values are contained in the syndrome vector 8. Each respective even syndrome vector value can be computed by squaring the preceding odd syndrome value in accordance with the equation $S_{2m}=(S_m)^2$. Thus, the syndrome vector 8 has only odd terms, and in this example embodiment, is a 39-word vector due to the fact that the chosen error correction capability for this example is 39 errors per received code word. If the syndrome vector is all zeros, the received code word $r_0$ through $r_{7679}$ is valid and contains no errors. Otherwise, the location and magnitude of the errors can be computed by the stages (not shown) of the decoder that follow the syndrome computation logic block, provided there are 39 or less bits in error. Generally, the error correction capability value, which is 39 in this embodiment, is a function of the block coding used and other variables, such as the width of the code word, which is n=7680 in this example.

With reference again to FIG. 2, the parity-check matrix 10 comprises 39 rows and n columns. Thus, the full parity-check matrix 10 is very large. Consequently, multiplication of the received code word vector 9 $r_n$ by the full parity-check matrix 10 would involve an enormous amount of computation logic and a large amount of time. To reduce the number of computations that must be performed, typical parity-bit generation techniques utilize a shift register approach, which requires a very small amount of logic, but which can only process one bit per cycle. This approach generally is suitable for low data rate systems, but in order for such an approach to be used in a high data rate system, the system would have to operate with a prohibitively fast clock speed.

Syndrome Computation of the Preferred Embodiment

FIG. 3 mathematically illustrates computation of the syndrome vector in accordance with the present invention, which uses a partial parity-check matrix in conjunction with a recursive computation algorithm that enables the syndrome vectors to be generated at very high speeds so that it is suitable for use in high data rate systems. In accordance with the present invention, the partial parity-check matrix 11 preferably has the same number of rows (39) as the full parity-check matrix 10 shown in FIG. 1, but has only i columns, where i is the width of the words (32 in this example) being processed each cycle. In contrast, the full parity-check matrix 10 has n columns (where n=7680 in this example). In this example embodiment where the width of the code word n=7680 bits, and the widths of the words processed each cycle is 32 bits, the resolved syndrome vector associated with the entire code word can be produced in 240 cycles (7680/32). This is a huge difference over the typical shift register approach where only one bit is processed per cycle, thus requiring n cycles to produce the resolved syndrome vector for an n-bit word, which, given the example parameters would require 7680 cycles to produce the resolved syndrome vector.

The powers of α in the parity-check matrices 10 and 11 are determined in accordance with Galois mathematics. The powers of α will vary depending on the particular implementation. Those skilled in the art will understand, in view of the description provided herein, the manner in which the partial parity-check matrix 10 of the present invention can be created using principles of Galois math and taking implementation details into account.

This enormous reduction in the size of the parity-check matrix in accordance with the present invention and its recursive use greatly reduces the amount of syndrome computation logic needed to compute the syndrome vector. A recursive algorithm is used during the matrix multiplication process that iteratively multiplies the syndrome vectors computed in previous cycles, which are intermediate syndrome vectors, by certain α values and then modulo-2 adds those intermediate syndrome vectors to the intermediate syndrome vectors produced during the current cycle. This iterative process continues until the syndrome vectors have been computed for all of the i-bit words of the n-bit code word, which would be 240 iterations in the example embodiment (7680/32).

In FIG. 3, the variable n, which corresponds to the number of bits in a code word (7680 in this example), is incremented by 1 after a 32-bit received word 12 has been processed. For example, during the first iteration when n=0, the received 32-bit word 12 will be the values for bits 0, 1, 2 . . . 31. During the second iteration when n=1, the received 32-bit word 12 will be values for bits 32, 33, 34 . . . . 63. During the third iteration when n-2, the received 32-bit word 11 will be the values for bits 64, 65, 66 . . . 95, and so on until n=7680 and the entire 7680-bit code word has been processed. The recursive portion of the algorithm is represented by the vector 13. During the iterations, as the vector 12 is being multiplied by the partial parity-check matrix 10, for each value of n, the values of $S_1$, $S_3$, $S_5$, $S_7$, $S_9$ . . . $S_{77}$ for the previous cycle are being multiplied by certain respective α values as shown to generate previous-cycle intermediate syndrome vectors, which are then modulo-2 added to the results of the multiplication of the received data vector 12 by the partial parity-check matrix 11. For each 32-bit received word, multiplication of vector 12 by matrix 11 results in 32-bit intermediate syndrome vectors, which are modulo-2 added to the respective syndrome vectors for the previous cycle, which are represented by vector 13. After 240 iterations (n/i=7680/32=240 in this example), the syndrome vector 20 is finally resolved for the respective code word.

Figure 4:
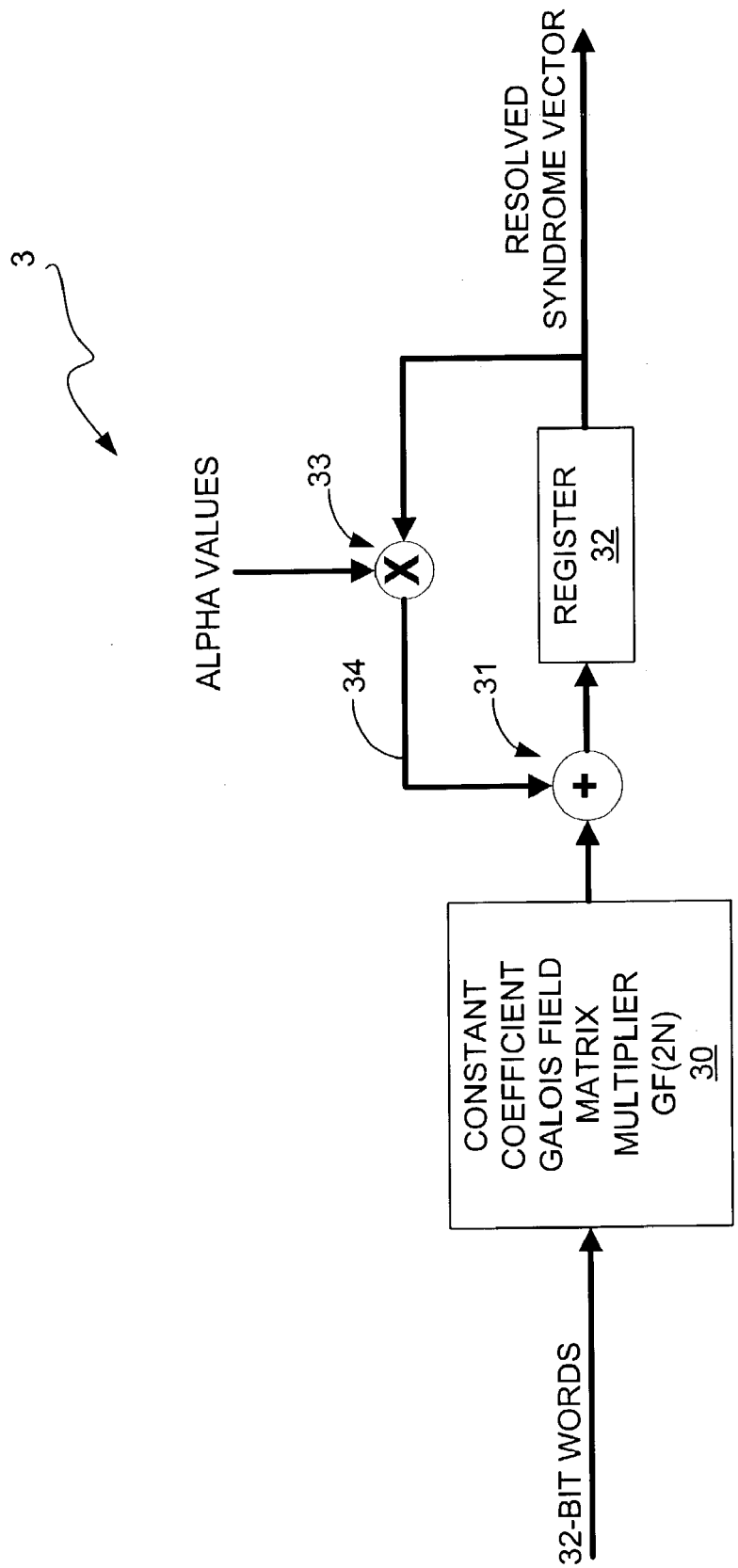
FIG. 4 is a block diagram of the syndrome computation logic block of the present invention in accordance with the preferred embodiment.

FIG. 4 is a block diagram of the syndrome computation logic block 3 (FIG. 1) of the present invention in accordance with the preferred embodiment. The block diagram represents the logic for processing an entire 7680-bit code word to generate a final, or resolved syndrome vector. As shown, all of the 32-bit words that make up the code word are processed by a constant-coefficient Galois field matrix multiplier $GF(2^N)$ 30, which performs the operations represented in FIG. 3 by the multiplication of received data vector 12 by the partial parity-check matrix 11. Galois field multipliers are known in the FEC art, and the present invention is not limited to using any particular Galois multiplier. The register 32 represents the storage of the intermediate syndrome vectors that are modulo-2 added together (current cycle with previous cycle values) as they are generated. After the last of the 32-bit words of the code word has been processed, the syndrome vector stored in the register 32 will be the resolved syndrome vector for the respective code word.

The multiplier logic 33 performs the multiplication operations represented in FIG. 3 by the vector 13, which shows the multiplication of the α values $\alpha^{32}$, $\alpha^{96}$ . . . $\alpha^{2464}$ by respective syndrome vectors $S_1[n-1]$, $S_3[n-1]$, $S_5[n-1]$ . . . $S_{77}[n-1]$ from the immediately preceding cycle. The adder logic 31 corresponds to the iterative modulo-2 addition of these previous-cycle syndrome vectors by the results of the multiplication of vector 12 with partial parity-check matrix 11. The feedback loop 34 indicates that the operations are iterative, or recursive, and that the intermediate syndrome vectors from previous cycles are modulo-2 added to the output of multiplier 33.

FIG. 4 is a schematic diagram of the syndrome computation logic used in accordance with the preferred embodiment of the present invention to perform the operations represented by the equation shown in FIG. 3. When a matrix is multiplied by a vector, terms are multiplied and the results of the multiplication operations are summed in a particular manner that is well known in linear algebra mathematics. In the equation shown in FIG. 3, the terms $R_{32*n+0}$ through $R_{32*n+31}$ and the α coefficients are binary multiplied by AND gates (not shown). The outputs of the AND gates are binary summed by XOR gates (not shown). The summed results are stored in memory, which is represented by register 32. The results of this multiplication are then modulo-2 added to the results of multiplication of vector 12 by matrix 11 for the current cycle and then stored in register 32 so that they will be available as syndrome values from the previous cycle on the next cycle.

As described above, this iterative process of computing syndrome values, storing them as intermediate syndrome values and then modulo-2 adding the stored, previous-cycle values to the syndrome values for the current cycle continues for 240 cycles in this example embodiment (n=7680/i=32), which is when the syndrome vector for the current code word is resolved.

Berlekamp Algorithm of the Preferred Embodiment

Figure 5:
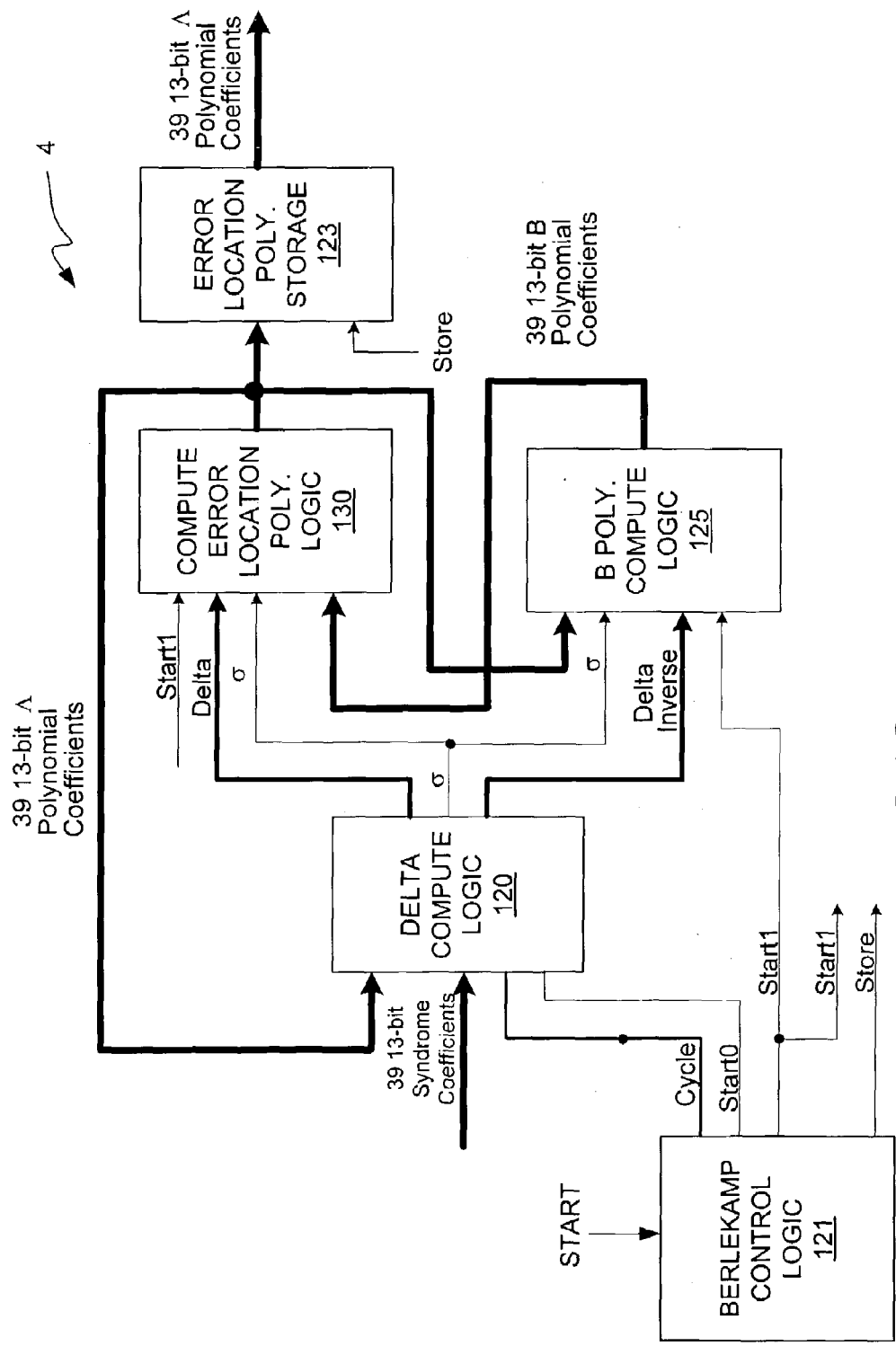
FIG. 5 is a block diagram of the Berlekamp algorithm logic block of the decoder of the present invention in accordance with the preferred embodiment.

FIG. 5 is a block diagram of the Berlekamp algorithm logic 4 (FIG. 1) of the present invention in accordance with the preferred embodiment for receiving the resolved syndrome vector and generating the error location polynomial. In FIG. 5, the thick black lines represent parallel data flow and the narrow dark lines represent single bit signal lines. Typical approaches to performing the Berlekamp algorithm process a single bit of the syndrome vector per cycle. The typical approach is not suitable for high data rate systems, especially where long block codes, such as long BCH codes, for example are used. For example, with the variables and parameters given above for the preferred embodiment of the decoder of the present invention, 6780 cycles (the width of the code word) would be required for typical Berlekamp algorithm logic to generate the error location polynomial. In accordance with the present invention, a syndrome vector can be processed in many fewer cycles (e.g., less than or, equal to approximately 60), thus enabling the present invention to be used in high data rate systems.

The Berlekamp logic block 4 comprises Berlekamp control logic 121, which controls the timing of the operations performed by the logic components 120, 123, 125 and 130. The delta compute logic block 120 comprises a Galois filed multiplier, which will be described below in detail in accordance with the preferred embodiment. By using a Galois field multiplier, the syndrome coefficients and the lambda (Λ) coefficients can be operated on very quickly and efficiently with a relatively small number of logic gates. The lambda (Λ) coefficients are the coefficients of the error location polynomial. Using the Galois field multiplier of the present invention enables the Berlekamp algorithm logic block 4 to generate many coefficients Λ of the error location polynomial in each cycle. For example, using the code word width (7680) and error correction capability (39) provided above, the first 20 iterations of the Berlekamp algorithm execute in a single system clock cycle and the last 19 iterations execute in 2 clock cycles. Therefore, in accordance with the preferred embodiment, the Berlekamp algorithm is capable of computing an error location polynomial in less than 60 system clock cycles. The error location polynomial produced in a Galois field $GF(2^{13})$ in accordance with the preferred embodiment can have an order as high as 39.

Figure 6:
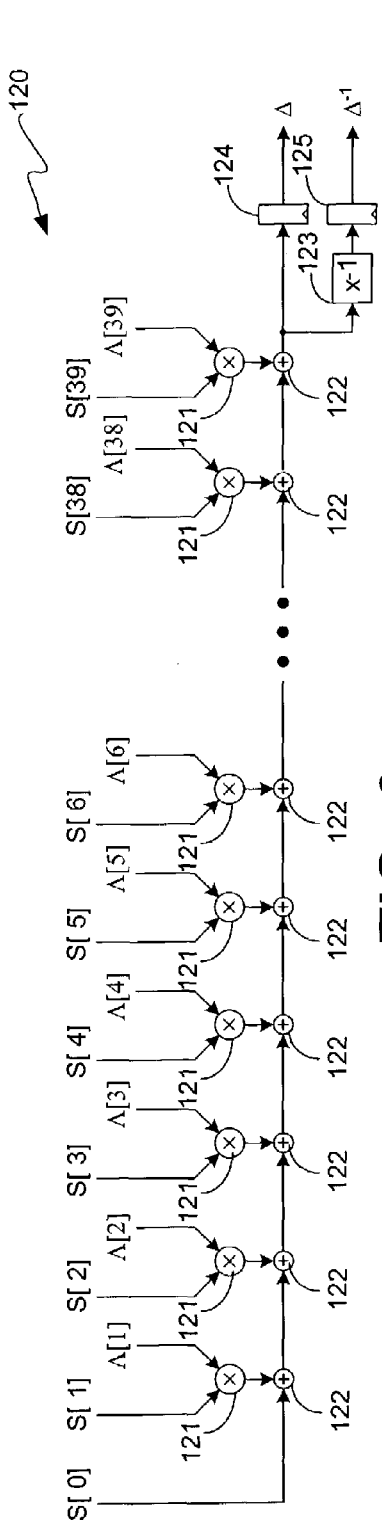
FIG. 6 is a schematic diagram of the delta compute logic represented in block diagram form in FIG. 5.
Figure 7:
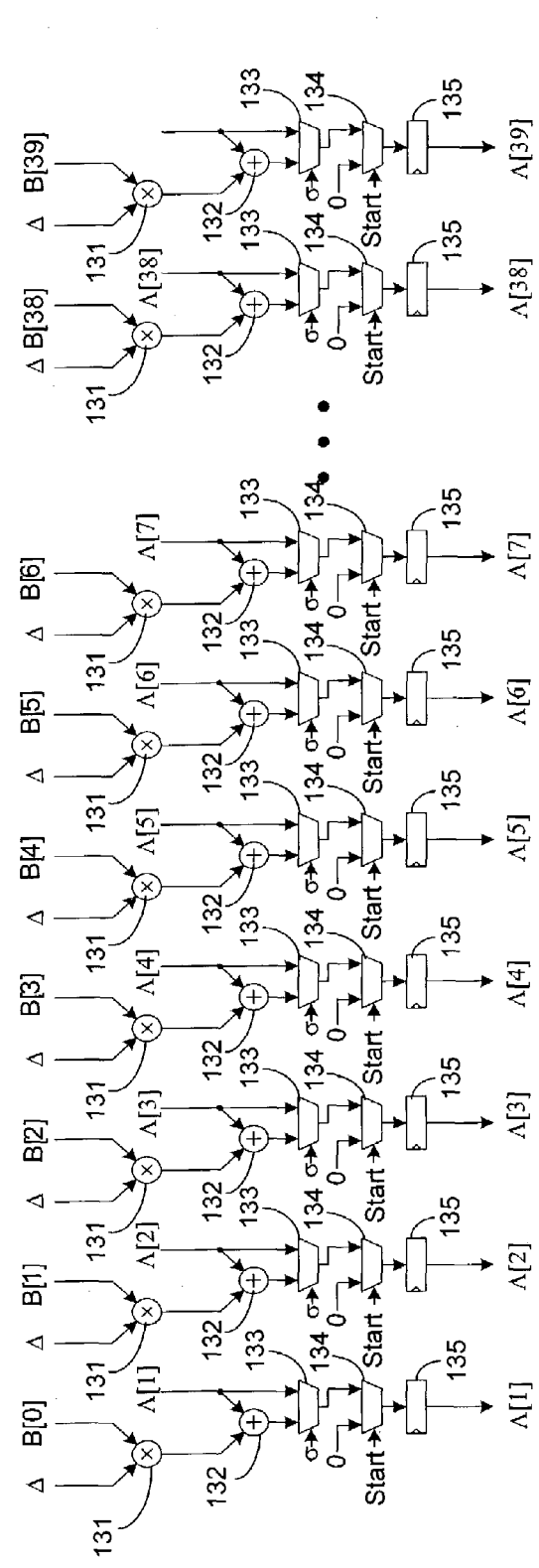
FIG. 7 is a schematic diagram of the compute error polynomial logic represented in block diagram form in FIG. 5.
Figure 8:
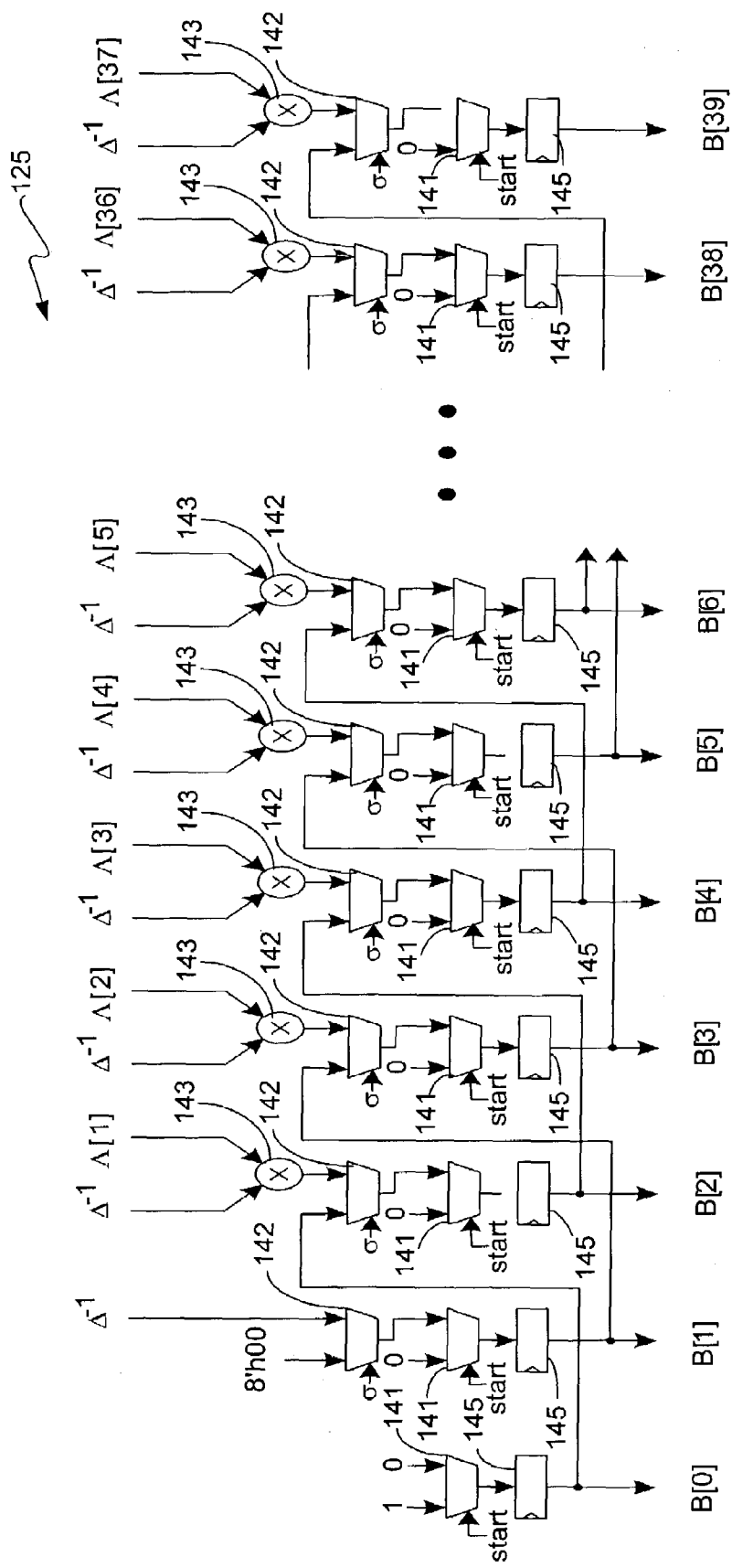
FIG. 8 is a schematic diagram of the B polynomial compute logic represented in block diagram form in FIG. 5.

The output of the delta computation logic block is 39 are delta (Δ) values that are either all 1s or all 0s and a sigma (σ). The delta values of the error location polynomial that are computed by the Galois multiplier of the delta compute logic 130 are delivered to the B polynomial compute logic 125 and to the compute error location polynomial logic block 130. The delta compute logic 120 also provides a sigma (σ) value to logic blocks 125 and 130, which is asserted when delta is 0 and when the order of the polynomial exceeds the cycle number. FIGS. 6 and 7 are schematic diagrams of the compute delta compute logic 120 and of the compute error location polynomial logic 130, respectfully. FIG. 8 is a schematic diagram of the B polynomial compute logic 125.

Each set of the multipliers 121 and respective adders in FIG. 6 preferably corresponds to a Galois field multiplier configured in the manner described below such that the number of logic gates needed to implement the multipliers is greatly reduced in comparison to the number of gates that would be used to implement that logic using typical known approaches. This reduction in logic is very significant because S[1] through S[39] and Λ[1] through Λ[39] are each 13-bit coefficients, and each multiplier performs 39 13-bit multiplication and addition operations in a relatively small number of clock cycles. In other words, 39 multiplies and 39 additions in $(GF2^3)$ are performed to compute delta and delta inverse. The output of the compute error location polynomial logic 120 is delta and the inverse of delta, as shown in FIG. 6. The box 123 having $x^{-1}$ inside indicates the inversion of delta. Delta and delta-inverted are stored in latches 124 and 125, respectively. Delta inverted may be obtained from a lookup table (not shown) using delta to address the lookup table.

FIG. 7, which illustrates the compute error location polynomial logic 130, also comprises multipliers 131 which multiply the coefficients of the B polynomial B[0] through B[39] by delta and adders 132, which add the results of the multiplication operations to the 13-bit coefficients of the lambda polynomial. The logic block 130 also comprises multiplexers 133 and 134 and registers 135. At the beginning of the error correction polynomial computation, Start (Start 1 in FIG. 5) is asserted, which causes the 0 inputs of the multiplexers 134 to be selected so that the initial coefficients of the lambda polynomial are initialized to 0 (i.e., all 0s are stored in the registers 135. When sigma to be asserted, the current values of the lambda coefficients are added to the results of multiplying the coefficients of the B polynomial by delta and stored in registers 135. When sigma is deasserted the current values of lambda coefficients are stored in the registers 135. The values of the lambda coefficients from the previous cycle are feedback as inputs to the compute delta logic 120, as indicated in FIG. 5 by the arrow from logic block 130 to logic block 120. The Galois multipiers of the compute delta logic block 120 use the lambda coefficient values from the previous cycle to compute the delta and delta inverse values for the current cycle, which are provided to the compute error polynomial logic block and to the B polynomial compute logic block 125, respectively.

A schematic diagram of the B polynomial compute logic 125 is shown in FIG. 8. When start (start1 in FIG. 5) is asserted, the multiplexers 141 select the 1 input for B[0] and the 0 inputs for B[1] through B[39], initializing the register 145 associated with B[0] to 1 and all other registers 145 for B[1] through B[39] to 0. After initialization, the current values of the lambda coefficients are received by logic block 125 from logic block 130, as indicated by the arrow in FIG. 5. Sigma is deasserted at this time causing the results of the multiplication by multipliers 103 of the lambda coefficients by delta inverse to be selected by multiplexers 142 and stored in registers 145. The coefficients of the B polynomial from the previous cycle are output from the registers 145 and provided to the compute error location polynomial logic block 130 where they are used to calculate the lambda coefficients for the current state, as indicated by the arrow from block 125 to block 130.

After the process described above with reference to FIGS. 5–8 has been performed for 39 iterations, the "Store" signal is asserted and the coefficients of the error location polynomial for the current state are stored in error location polynomial storage logic 123 (FIG. 5). After this happens, the error location polynomial is available for use by the Chien search logic block 5 (FIG. 1) of the present invention, which is described below in detail with respect to the preferred embodiment.

Having described the Berlekamp algorithm logic of the present invention in accordance with the preferred embodiment, the Galois multiplier that is preferably used therein by the compute delta logic block 120 will now be described with reference to a binary extension field of $2^{13}$ terms (i.e., logic 1s and 0s corresponding to the coefficients of a $13^{th}$ order polynomial). It should be noted, however, that the present invention applies equally to Galois multipliers having larger and smaller binary extension fields. In other words, the reduction in the number of logic gates needed to implement the Galois multiplier of the present invention will be reduced regardless of the size of the Galois field. The present invention is being described only with reference to a Galois multiplier having a binary extension field of $2^{13}$ for purposes of brevity and for ease of illustration. Those skilled in the art will understand, in view of the description provided herein, the manner in which the concepts and principles of the present invention can be applied to reduce the number of logic gates needed to implement a Galois multiplier having a binary extension field of any size. In essence, it will be first shown mathematically how, in accordance with the present invention, the number of terms associated with a Galois binary extension field can be reduced, and then it will be shown physically how the number of logic gates needed to operate on the reduced number of terms can be reduced accordingly.

Galois Field Multiplier of the Preferred Embodiment for Berlekamp Algorithm $GF(2^{13})$ is a common notation for a Galois Field or Finite Field with $2^{13}$ elements, which corresponds to 8192 elements. This notation indicates a binary extension field where each of the 8192 elements in the field is represented by an n-order binary polynomial. The polynomial $X^{12}+X^7+X^6+X^2+1$ is an example of a binary polynimial in $GF(2^{13})$ that could constitute one of the 8192 elements. This polynomial can also be represented by the binary number 1000011000101. It should be noted that there is a logic 1 in the position of each non-zero element in the polynomial and logic 0s are in the positions where there are no elements. This can easily be seen when the polynomial $X^{12}+X^7+X^6+X^2+1$ is expressed as: $1X^{12}+0X^{11}+0X^{10}+0X^9+0X^8+1X^7+1X^6+0X^5+0X^4+0X^3+X^2+1$.

When two polynomials are added, each element in the polynomial is added with modulo-2 (i.e., exclusive OR (XOR)) arithmetic to the element of the other polynomial with the same power of X. The following example demonstrates the modulo-2 addition of two polynomials:

$$1X^{12}+1X^{11}+1X^{10}+0X^9+1X^8+0X^7+1X^6+0X^5+1X^4+1X^3+ \\ 1X^2+1X+1+1X^{12}+0X^{11}+1X^{10}+1X^9+1X^8+0X^7+ \\ 0X^6+1X^5+1X^4+0X^3+1X^2+0X+1 = 0\ 1\ 0\ 1\ 0\ 0\ 1\ 1\ 0\ 1\ 0\ 1\ 0$$

Using the alternative notation with only the coefficients of the polynomials shown, the modulo-2 addition produces the following results:

$$1110101011111+1011100110101=0101001101010$$

The multiplication performed by a Galois multiplier is quite a bit more complicated. Generally, multiplication by a Galois multiplier involves the multiplication of the two polynomials modulo another polynomial. The two Galois Field elements in $GF(2^{13})$, designated as A and B herein, are defined by the following binary polynomials:

$$A[X]=a_{12}X^{12}+a_{11}X^{11}+a_{10}X^{10}+a_9X^9+a_8X^8+a_7X^7+ \\ a_6X^6+a_5X^5+a_4X^4+a_3X^3+a_2X^2+a_1X^1+a_0$$

$$B[X]=b_{12}X^{12}+b_{11}X^{11}+b_{10}X^{10}+b_9X^9+b_8X^8+b_7X^7+ \\ b_6X^6+b_5X^5+b_4X^4+b_3X^3+b_2X^2+b_1X^1+b_0$$

Multiplication of the elements A and B in $GF(2^{13})$ is defined by the following equation:

$$D[X]=A[X]*B[X]\ modulo(X^{13}+X^4+X^3+X+1)$$

Multiplication of Elements A and B Resulting in the Following Polynomial D[X]

The 39 13-bit syndrome coefficients and the 39 13-bit lambda coefficients correspond to the polynomials A and B, respectively. The result of the multiplication of A and B in the $GF(2^{13})$ field is the polynomial D[X] having the following terms:

$$D[X]=d_{12}X^{12}+d_{11}X^{11}+d_{10}X^{10}+d_9X^9+d_8X^8+d_7X^7+ \\ d_6X^6+d_5X^5+d_4X^4+d_3X^3+d_2X^2+d_1X^1+d_0$$

where the coefficients of D[X] are defined as follows:

$d_0=a_0b_0+a_1b_{12}+a_2b_{11}+a_3b_{10}+a_4b_9+a_5b_8+a_6b_7+a_7b_6+a_8b_5+a_9b_4+a_{10}b_3+a_{10}b_{12}+a_{11}b_2+a_{11}b_{11}+a_{11}b_{12}+a_{12}b_1+a_{12}b_{10}+a_{12}b_{11}$;

$d_1=a_0b_1+a_1b_0+a_1b_{12}+a_2b_{11}+a_2b_{12}+a_3b_{10}+a_3b_{11}+a_4b_9+a_4b_{10}+a_5b_8+a_5b_9+a_6b_7+a_6b_8+a_7b_6+a_7b_7+a_8b_5+a_8b_6+a_9b_4+a_9b_5+a_{10}b_3+a_{10}b_4+a_{10}b_{12}+a_{11}b_2+a_{11}b_3+a_{11}b_{11}+a_{12}b_1+a_{12}b_2+a_{12}b_{10}+a_{12}b_{12}$;

$d_2=a_0b_2+a_1b_1+a_2b_0+a_2b_{12}+a_3b_{11}+a_3b_{12}+a_4b_{10}+a_4b_{11}+a_5b_9+a_5b_{10}+a_6b_8+a_6b_9+a_7b_7+a_7b_8+a_8b_6+a_8b_7+a_9b_5+a_9b_6+a_{10}b_4+a_{10}b_5+a_{11}b_3+a_{11}b_4+a_{11}b_{12}+a_{12}b_2+a_{12}b_3+a_{12}b_{11}$;

$d_3=a_0b_3+a_1b_2+a_1b_{12}+a_2b_1+a_2b_{11}+a_3b_0+a_3b_{10}+a_3b_{12}+a_4b_9+a_4b_{11}+a_4b_{12}+a_5b_8+a_5b_{10}+a_5b_{11}+a_6b_7+a_6b_9+a_6b_{10}+a_7b_6+a_7b_8+a_7b_9+a_8b_5+a_8b_7+a_8b_8+a_9b_4+a_9b_6+a_9b_7+a_{10}b_3+a_{10}b_5+a_{10}b_6+a_{10}b_{12}+a_{11}b_2+a_{11}b_4+a_{11}b_5+a_{11}b_{11}+a_{11}b_{12}+a_{12}b_1+a_{12}b_3+a_{12}b_4+a_{12}b_{10}a_{12}b_{11}+a_{12}b_{12}$;

$d_4=a_0b_4+a_1b_3+a_1b_{12}+a_2b_2+a_2b_{11}+a_2b_{12}+a_3b_1+a_3b_{10}+a_3b_{11}+a_4b_0+a_4b_9+a_4b_{10}+a_4b_{12}+a_5b_8+a_5b_9+a_5b_{11}+a_5b_{12}+a_6b_7+a_6b_8+a_6b_{10}+a_6b_{11}+a_7b_6+a_7b_7+a_7b_9+a_7b_{10}+a_8b_5+a_8b_6+a_8b_8+a_8b_9+a_9b_4+a_9b_5+a_9b_7+a_9b_8+a_{10}b_3+a_{10}b_4+a_{10}b_6+a_{10}b_7+a_{10}b_{12}+a_{11}b_2+a_{11}b_3+a_{11}b_5+a_{11}b_6+a_{11}b_{11}+a_{12}b_1+a_{12}b_2+a_{12}b_4+a_{12}b_5+a_{12}b_{10}+a_{12}b_{12}$;

$d_5=a_0b_5+a_1b_4+a_2b_3+a_2b_{12}+a_3b_2+a_3b_{11}+a_3b_{12}+a_4b_1+a_4b_{10}+a_4b_{11}+a_5b_0+a_5b_9+a_5b_{10}+a_5b_{12}+a_6b_8+a_6b_9+a_6b_{11}+a_6b_{12}+a_7b_7+a_7b_8+a_7b_{10}+a_7b_{11}+a_8b_6+a_8b_7+a_8b_9+a_8b_{10}+a_9b_5+a_9b_6+a_9b_8+a_9b_9+a_{10}b_4+a_{10}b_5+a_{10}b_7+a_{10}b_8+a_{11}b_3+a_{11}b_4+a_{11}b_6+a_{11}b_7+a_{11}b_{12}+a_{12}b_2+a_{12}b_3+a_{12}b_5+a_{12}b_6+a_{12}b_{11}$;

$d_6=a_0b_6+a_1b_5+a_2b_4+a_3b_3+a_3b_{12}+a_4b_2+a_4b_{11}+a_4b_{12}+a_5b_1+a_5b_{10}+a_5b_{11}+a_6b_0+a_6b_9+a_6b_{10}+a_6b_{12}+a_7b_8+a_7b_9+a_7b_{11}+a_7b_{12}+a_8b_7+a_8b_8+a_8b_{10}+a_8b_{11}+a_9b_6+a_9b_7+a_9b_9+a_9b_{10}+a_{10}b_5+a_{10}b_6+a_{10}b_8+a_{10}b_9+a_{11}b_4+a_{11}b_5+a_{11}b_7+a_{11}b_8+a_{12}b_3+a_{12}b_4+a_{12}b_6+a_{12}b_7+a_{12}b_{12}$;

$d_7=a_0b_7+a_1b_6+a_2b_5+a_3b_4+a_4b_3+a_4b_{12}+a_5b_2+a_5b_{11}+a_5b_{12}+a_6b_1+a_6b_{10}+a_6b_{11}+a_7b_0+a_7b_9+a_7b_{10}+a_7b_{12}+a_8b_8+a_8b_9+a_8b_{11}+a_8b_{12}+a_9b_7+a_9b_8+a_9b_{10}+a_9b_{11}+a_{10}b_6+a_{10}b_7+a_{10}b_9+a_{10}b_{10}+a_{11}b_5+a_{11}b_6+a_{11}b_8+a_{11}b_9+a_{12}b_4+a_{12}b_5+a_{12}b_7+a_{12}b_8$;

$d_8=a_0b_8+a_1b_7+a_2b_6+a_3b_5+a_4b_4+a_5b_3+a_5b_{12}+a_6b_2+a_6b_{11}+a_6b_{12}+a_7b_1+a_7b_{10}+a_7b_{11}+a_8b_0+a_8b_9+a_8b_{10}+a_8b_{12}+a_9b_8+a_9b_9+a_9b_{11}+a_9b_{12}+a_{10}b_7+a_{10}b_8+a_{10}b_{10}+a_{10}b_{11}+a_{11}b_6+a_{11}b_7+a_{11}b_9+a_{11}b_{10}+a_{12}b_5+a_{12}b_6+a_{12}b_8+a_{12}b_9$;

$d_9=a_0b_9+a_1b_8+a_2b_7+a_3b_6+a_4b_5+a_5b_4+a_6b_3+a_6b_{12}+a_7b_2+a_7b_{11}+a_7b_{12}+a_8b_1+a_8b_{10}+a_8b_{11}+a_9b_0+a_9b_9+a_9b_{10}+a_9b_{12}+a_{10}b_8+a_{10}b_9+a_{10}b_{11}+a_{10}b_{12}+a_{11}b_7+a_{11}b_8+a_{11}b_{10}+a_{11}b_{11}+a_{12}b_6+a_{12}b_7+a_{12}b_9+a_{12}b_{10}$;

$d_{10}=a_0b_{10}+a_1b_9+a_2b_8+a_3b_7+a_4b_6+a_5b_5+a_6b_4+a_7b_3+a_7b_{12}+a_8b_2+a_8b_{11}+a_8b_{12}+a_9b_1+a_9b_{10}+a_9b_{11}+a_{10}b_0+a_{10}b_9+a_{10}b_{10}+a_{10}b_{12}+a_{11}b_8+a_{11}b_9+a_{11}b_{11}+a_{11}b_{12}+a_{12}b_7+a_{12}b_8+a_{12}b_{10}+a_{12}b_{11}$;

$d_{11}=a_0b_{11}+a_1b_{10}+a_2b_9+a_3b_8+a_4b_7+a_5b_6+a_6b_5+a_7b_4+a_8b_3+a_8b_{12}+a_9b_2+a_9b_{11}+a_9b_{12}+a_{10}b_1+a_{10}b_{10}+a_{10}b_{11}+a_{11}b_0+a_{11}b_9+a_{11}b_{10}+a_{11}b_{12}+a_{12}b_8+a_{12}b_9+a_{12}b_{11}+a_{12}b_{12}$;

$d_{12}=a_0b_{12}+a_1b_{11}+a_2b_{10}+a_3b_9+a_4b_8+a_5b_7+a_6b_6+a_7b_5+a_8b_4+a_9b_3+a_9b_{12}+a_{10}b_2+a_{10}b_{11}+a_{10}b_{12}+a_{11}b_1+a_{11}b_{10}+a_{11}b_{11}+a_{12}b_0+a_{12}b_9+a_{12}b_{10}+a_{12}b_{12};$

In the context of the Berlekamp logic block 4 shown in FIG. 5, the terms $d_0$ through $d_{12}$ correspond to the delta values that are generated by the compute delta logic block and output therefrom to the computer error location polynomial logic block 30 (the inverted delta values are output to logic block 25). It is apparent that a very large number of logic gates would be needed to perform the mathematic operations indicated above to obtain the $d_n$ terms, $d_0$ through $d_{12}$. In accordance with the present invention, it has been determined that the terms $d_0$ through $d_{12}$ shown above can be reduced as follows by using $c_r$ terms, $c_0$ through $c_{48}$, which are derived from the $a_n$ terms, $a_0$ through $a_{12}$:

$d_0=b_0c_0+b_1c_{12}+b_2c_{11}+b_3c_{10}+b_4c_9+b_5c_8+b_6c_7+b_7c_6+b_8c_5+b_9c_4+b_{10}c_{16}+b_{11}c_{28}+b_{12}c_{26};$ $d_1=b_0c_1+b_1c_{13}+b_2c_{24}+b_3c_{23}+b_4c_{22}+b_5c_{21}+b_6c_{20}+b_7c_{19}+b_8c_{18}+b_9c_{17}+b_{10}c_{29}+b_{11}c_{27}+b_{12}c_{37};$ $d_2=b_0c_2+b_1c_1+b_2c_{13}+b_3c_{24}+b_4c_{23}+b_5c_{22}+b_6c_{21}+b_7c_{20}+b_8c_{19}+b_9c_{18}+b_{10}c_{17}+b_{11}c_{29}+b_{12}c_{27};$ $d_3=b_0c_3+b_1c_{15}+b_2c_{14}+b_3c_{25}+b_4c_{35}+b_5c_{34}+b_6c_{33}+b_7c_{32}+b_8c_{31}+b_9c_{30}+b_{10}c_{38}+b_{11}c_{45}+b_{12}c_{48};$ $d_4=b_0c_4+b_1c_{16}+b_2c_{28}+b_3c_{26}+b_4c_{36}+b_5c_{43}+b_6c_{42}+b_7c_{41}+b_8c_{40}+b_9c_{39}+b_{10}c_{46}+b_{11}c_{44}+b_{12}c_{47};$ $d_5=b_0c_5+b_1c_4+b_2c_{16}+b_3c_{28}+b_4c_{26}+b_5c_{36}+b_6c_{43}+b_7c_{42}+b_8c_{41}+b_9c_{40}+b_{10}c_{39}+b_{11}c_{46}+b_{12}c_{44};$ $d_6=b_0c_6+b_1c_5+b_2c_4+b_3c_{16}+b_4c_{28}+b_5c_{26}+b_6c_{36}+b_7c_{43}+b_8c_{42}+b_9c_{41}+b_{10}c_{40}+b_{11}c_{39}+b_{12}c_{46};$ $d_7=b_0c_7+b_1c_6+b_2c_5+b_3c_4+b_4c_{16}+b_5c_{28}+b_6c_{26}+b_7c_{36}+b_8c_{43}+b_9c_{42}+b_{10}c_{41}+b_{11}c_{40}+b_{12}c_{39};$ $d_8=b_0c_8+b_1c_7+b_2c_6+b_3c_5+b_4c_4+b_5c_{16}+b_6c_{28}+b_7c_{26}+b_8c_{36}+b_9c_{43}+b_{10}c_{42}+b_{11}c_{41}+b_{12}c_{40};$ $d_9=b_0c_9+b_1c_8+b_2c_7+b_3c_6+b_4c_5+b_5c_4+b_6c_{16}+b_7c_{28}+b_8c_{26}+b_9c_{36}+b_{10}c_{43}+b_{11}c_{42}+b_{12}c_{41};$ $d_{10}=b_0c_{10}+b_1c_9+b_2c_8+b_3c_7+b_4c_6+b_5c_5+b_6c_4+b_7c_{16}+b_8c_{28}+b_9c_{26}+b_{10}c_{36}+b_{11}c_{43}+b_{12}c_{42};$ $d_{11}=b_0c_{11}+b_1c_{10}+b_2c_9+b_3c_8+b_4c_7+b_5c_6+b_6c_5+b_7c_4+b_8c_{16}+b_9c_{28}+b_{10}c_{26}+b_{11}c_{36}+b_{12}c_{43};$ $d_{12}=b_0c_{12}+b_1c_{11}+b_2c_{10}+b_3c_9+b_4c_8+b_5c_7+b_6c_6+b_7c_5+b_8c_4+b_9c_{16}+b_{10}c_{28}+b_{11}c_{26}+b_{12}c_{36};$

The set of terms $c_r$ is defined as follows:

$c_0=a_0;$
$c_1=a_1;$
$c_2=a_2;$
$c_3=a_3;$
$c_4=a_4;$
$c_5=a_5;$
$c_6=a_6;$
$c_7=a_7;$
$c_8=a_8;$
$c_9=a_9;$
$c_{10}=a_{10};$
$c_{11}=a_{11};$
$c_{12}=a_{12};$
$c_{13}=a_0+a_{12};$
$c_{14}=a_1+a_{11};$
$c_{15}=a_2+a_{12};$
$c_{16}=a_3+a_{12};$
$c_{17}=a_4+a_5;$
$c_{18}=a_5+a_6;$
$c_{19}=a_6+a_7;$
$c_{20}=a_7+a_8;$
$c_{21}=a_8+a_9;$
$c_{22}=a_9+a_{10};$
$c_{23}=a_{10}+a_{11};$
$c_{24}=a_{11}+a_{12};$
$c_{25}=a_0+a_{10}+a_{12};$
$c_{26}=a_1+a_{10}+a_{11};$
$c_{27}=a_2+a_3+a_{11};$
$c_{28}=a_2+a_{11}+a_{12};$
$c_{29}=a_3+a_4+a_{12};$
$c_{30}=a_4+a_6+a_7;$
$c_{31}=a_5+a_7+a_8;$
$c_{32}=a_6+a_8+a_9;$
$c_{33}=a_7+a_9+a_{10};$
$c_{34}=a_8+a_{10}+a_{11};$
$c_{35}=a_9+a_{11}+a_{12};$
$c_{36}=a_0+a_9+a_{10}+a_{12};$
$c_{37}=a_1+a_2+a_{10}+a_{12};$
$c_{38}=a_3+a_5+a_6+a_{12};$
$c_{39}=a_4+a_5+a_7+a_8;$
$c_{40}=a_5+a_6+a_8+a_9;$
$c_{41}=a_6+a_7+a_9+a_{10};$
$c_{42}=a_7+a_8+a_{10}+a_{11};$
$c_{43}=a_8+a_9+a_{11}+a_{12};$
$c_{44}=a_2+a_3+a_5+a_6+a_{11};$
$c_{45}=a_2+a_4+a_5+a_{11}+a_{12};$
$c_{46}=a_3+a_4+a_6+a_7+a_{12};$
$c_{47}=a_1+a_2+a_4+a_5+a_{10}+a_{12};$
$c_{48}=a_1+a_3+a_4+a_{10}+a_{11}+a_{12};$

Figure 9:
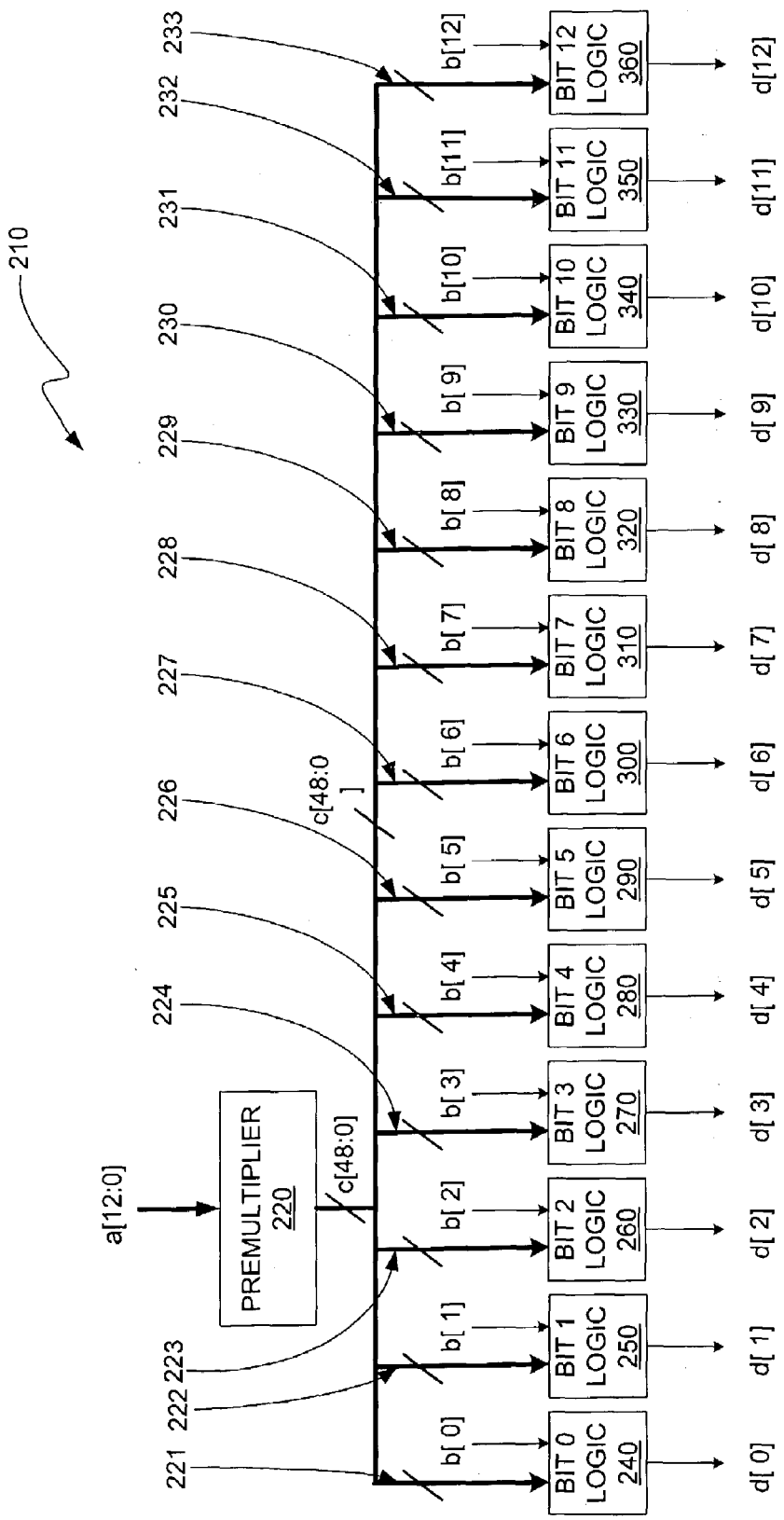
FIG. 9 is a block diagram of the Galois multiplier of the present invention in accordance with an example embodiment wherein the multiplier is based on a $13^{th}$-order polynomial.

As a result of the above simplification of the present invention, the Galois multiplier of the present invention has been implemented with at least about a 40% reduction in the number of gates typically used to implement a Galois multiplier. FIG. 9 is a block diagram of the Galois multiplier 210 of the present invention in accordance with an example embodiment wherein the multiplier 210 is based on a $13^{th}$-order polynomial. As stated above, the principles and concepts of the present invention can be applied to any Galois filed size, as will be understood by those skilled in the art in view of the description provided herein.

Figure 10:
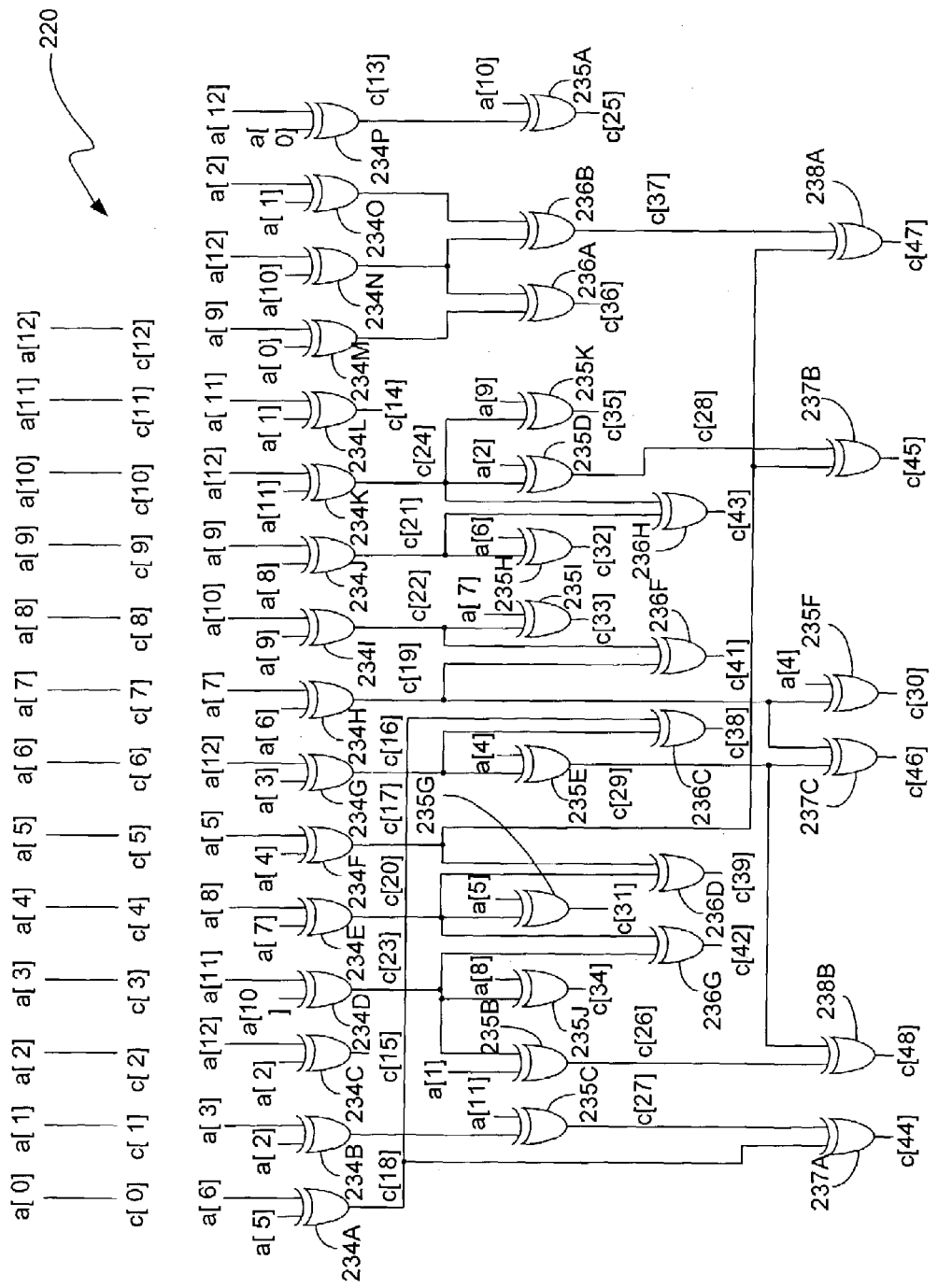
FIG. 10 is a schematic diagram of the premultiplier logic component of the present invention shown in FIG. 9.

The Galois multiplier 210, which preferably is implemented in hardware in an application specific integrated circuit (ASIC), which comprises a premultiplier 220 that generates the terms $c_0$ through $c_{48}$ from the terms $a_0$ through $a_{12}$, as described below in detail with reference to FIG. 10. The premultiplier 220 produces the $c_r$ terms, $c_0$ through $c_{48}$. As can be seen from the listing of the $c_r$ terms above, terms $c_0$ through $c_{12}$ correspond to terms $a_0$ through $a_{12}$, respectively. Therefore, no operations are performed to produce terms $c_0$ through $c_{12}$. The remainder of the $c_r$ terms, $c_{13}$ through $c_{48}$, are produced by summing (i.e., XORing) various an terms, as described below in detail with reference to FIG. 10. The $c_r$ terms are then operated on by multiplication logic (e.g., AND gates) and addition logic (e.g., XOR gates) by bit logic configurations 240, 250, 260, 270, 280, 290, 300, 310, 320, 330, 340, 350 and 360 to produce terms d[0], d[1], d[2], d[3], d[4], d[5], d[6], d[7], d[8], d[9], d[10], d[11] and d[12], respectively, thereby completing the Galois multiplication. FIGS. 11, 12, 13, 14, 15, 16, 17, 18, 19, 20, 21, 22 and 23 are schematic diagrams illustrating bit logic 240, 250, 260, 270, 280, 290, 300, 310, 320, 330, 340, 350 and 360, respectively, and those diagrams will be discussed below in detail.

The arrows 221 through 233 in FIG. 9 point to thirteen, 13-bit lines that each provide thirteen various $c_r$ terms to each of the thirteen logic circuits 240 through 360, as described below in detail with reference to FIGS. 11 through 23, respectively. Before describing the bit logic circuits 240 through 360, the premultiplier logic 220 that produces the $c_r$ terms will first be described with reference to FIG. 10. As shown in FIG. 10, bits a[0]–a[12] correspond directly to bits c[0]–c[12], respectively. However, bits c[13]–c[48] are produced by modulo-2 adding various $a_n$ terms together, which are performed with XOR logic gates 234A–234P, 234A–234K, 235A–235H, 236A–236C and 237A and B. The XOR gates that sum only 2 bits correspond to XOR gates 21A–21P. The XOR gates that sum 3 bits correspond to XOR gates 235A–235K. The XOR gates that sum 4 bits correspond to XOR gates 236A–236H. The XOR gates that sum 5 bits correspond to XOR gates 237A–237C. The XOR gates that sum 6 bits correspond to XOR gates 238A and 223B. The diagram illustrated in FIG. 10 clearly indicates which bits are summed to obtain the 49 $c_r$ terms.

Figure 11:
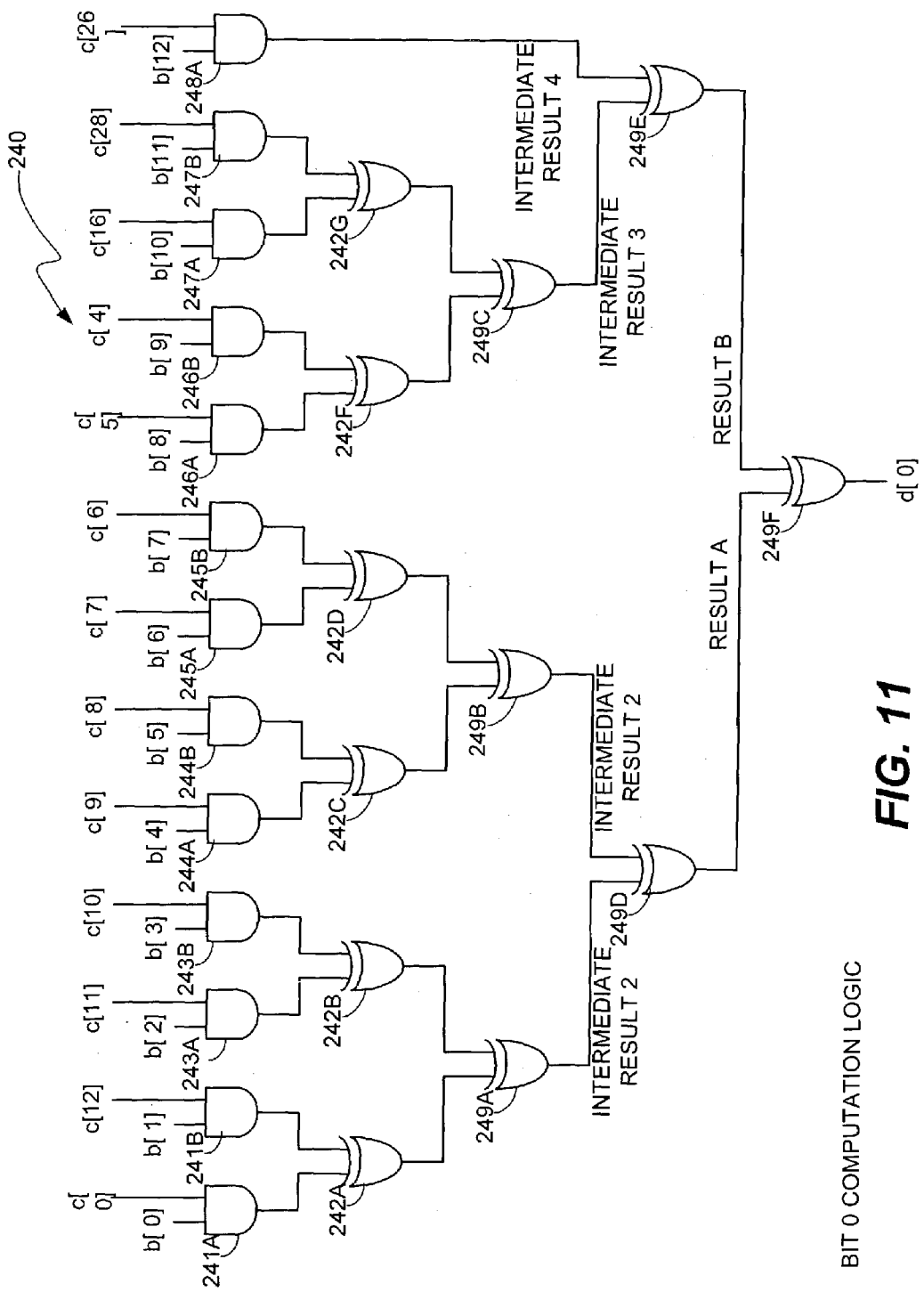
FIG. 11 is a schematic diagram of the binary multiplication and addition logic shown in block diagram form in FIG. 9 for determining bit d[0].

Once the 49 $c_r$ terms have been produced by the premultiplier 220, various 13-bit groups of $c_r$ terms are processed by each of the 13 multiplication/addition logic circuits shown in FIGS. 11–23. The manner in which each of these circuits operates to produce the d[0]–d[12] terms will now be described. FIG. 11 schematically illustrates the multiplication/addition logic 240 for generating the d[0] term. With reference to FIG. 11, AND gates 241A and 241B multiply bits b[0] and c[0] together and bits b[1] and c[12] together, respectively. The results of these two ANDing operations are then modulo-2 added together by XOR gate 242A. AND gates 243A and 243B multiply bits b[2] and c[11] together and bits b[3] and c[10] together, respectively. The results of these two ANDing operations are then modulo-2 added together by XOR gate 242B. The outputs of XOR gates 242A and 242B are then modulo-2 added together by XOR gate 249A to produce intermediate result 1.

Likewise, AND gates 244A and 244B multiply bits b[4] and c[9] together and bits b[5] and c[8] together, respectively. The results of these two ANDing operations are then modulo-2 added together by XOR gate 242C. AND gates 245A and 245B multiply bits b[6] and c[7] together and bits b[7] and c[6] together, respectively. The results of these two ANDing operations are then modulo-2 added together by XOR gate 242D. The outputs of XOR gates 242C and 242D are then modulo-2 added together by XOR gate 249B to produce intermediate result 2. Intermediate results 1 and 2 are then modulo-2 added together by XOR gate 249D to produce result A.

Likewise, AND gates 246A and 246B multiply bits b[8] and c[5] together and bits b[9] and c[4] together, respectively. The results of these two ANDing operations are then modulo-2 added together by XOR gate 242F. AND gates 247A and 247B multiply bits b[11] and c[28] together and bits b[12] and c[26] together, respectively. The results of these two ANDing operations are then modulo-2 added together by XOR gate 242G. The outputs of XOR gates 242F and 242G are then modulo-2 added together by XOR gate 249C to produce intermediate result 3. Bits b[12] and c[26] are multiplied together by AND gate 248A, and the results of that operation are modulo-2 added to intermediate result 3 by XOR gate 249E to produce result B. Results A and B are then modulo-2 added together by XOR gate 249F to produce term d[0].

Figure 12:
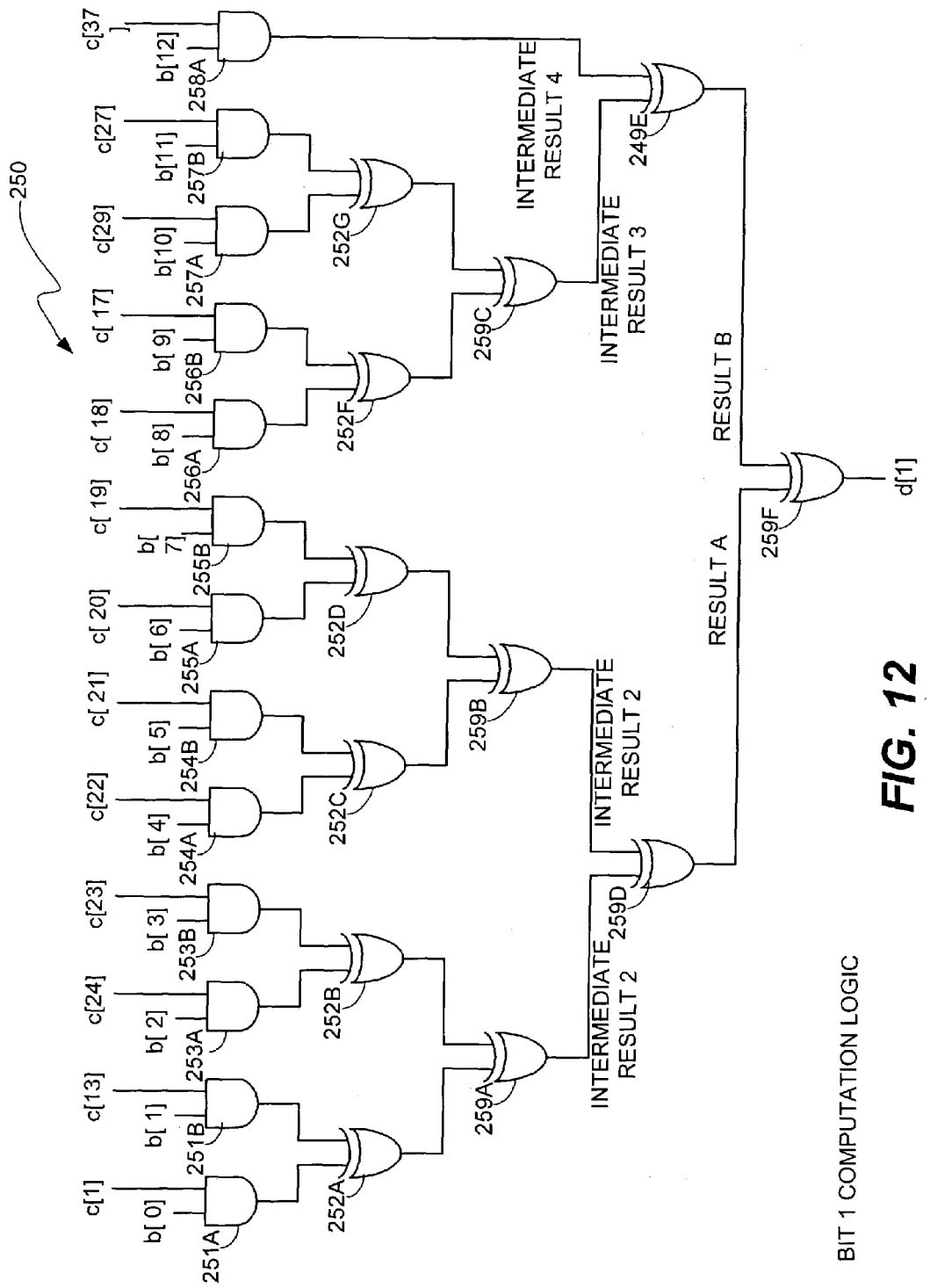
FIG. 12 is a schematic diagram of the binary multiplication and addition logic shown in block diagram form in FIG. 9 for determining bit d[1].

FIG. 12 schematically illustrates the multiplication/addition logic 250 for generating the d[1] term. With reference to FIG. 12, AND gates 251A and 251B multiply bits b[0] and c[1] together and bits b[1] and c[13] together, respectively. The results of these two ANDing operations are then modulo-2 added together by XOR gate 252A. AND gates 253A and 253B multiply bits b[2] and c[24] together and bits b[3] and c[23] together, respectively. The results of these two ANDing operations are then modulo-2 added together by XOR gate 252B. The outputs of XOR gates 252A and 252B are then modulo-2 added together by XOR gate 259A to produce intermediate result 1.

Likewise, AND gates 254A and 254B multiply bits b[4] and c[22] together and bits b[5] and c[21] together, respectively. The results of these two ANDing operations are then modulo-2 added together by XOR gate 252C. AND gates 255A and 255B multiply bits b[6] and c[20] together and bits b[7] and c[19] together, respectively. The results of these two ANDing operations are then modulo-2 added together by XOR gate 252D. The outputs of XOR gates 252C and 252D are then modulo-2 added together by XOR gate 259B to produce intermediate result 2. Intermediate results 1 and 2 are then modulo-2 added together by XOR gate 259D to produce result A.

Likewise, AND gates 256A and 256B multiply bits b[8] and c[18] together and bits b[9] and c[17] together, respectively. The results of these two ANDing operations are then modulo-2 added together by XOR gate 252F. AND gates 257A and 257B multiply bits b[11] and c[27] together and bits b[12] and c[37] together, respectively. The results of these two ANDing operations are then modulo-2 added together by XOR gate 252G. The outputs of XOR gates 252F and 252G are then modulo-2 added together by XOR gate 259C to produce intermediate result 3. Bits b[12] and c[37] are multiplied together by AND gate 258A, and the results of that operation are modulo-2 added to intermediate result 3 by XOR gate 259E to produce result B. Results A and B are then modulo-2 added together by XOR gate 259F to produce term d[1].

Figure 13:
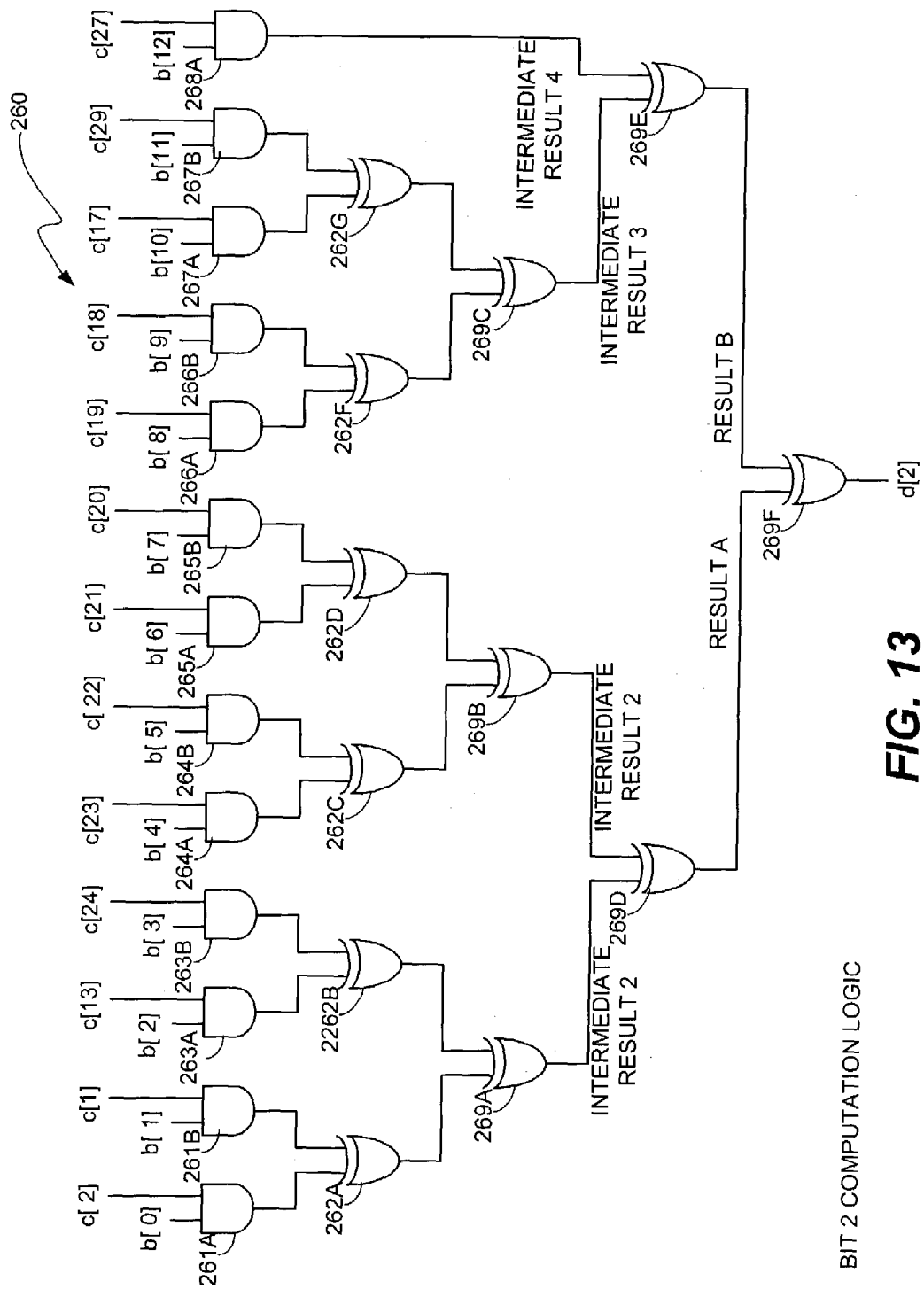
FIG. 13 is a schematic diagram of the binary multiplication and addition logic shown in block diagram form in FIG. 9 for determining bit d[2].

FIG. 13 schematically illustrates the multiplication/addition logic 260 for generating the d[2] term. With reference to FIG. 13, AND gates 261A and 61B multiply bits b[0] and c[2] together and bits b[1] and c[1] together, respectively. The results of these two ANDing operations are then modulo-2 added together by XOR gate 262A. AND gates 263A and 263B multiply bits b[2] and c[13] together and bits b[3] and c[24] together, respectively. The results of these two ANDing operations are then modulo-2 added together by XOR gate 262B. The outputs of XOR gates 262A and 262B are then modulo-2 added together by XOR gate 269A to produce intermediate result 1.

Likewise, AND gates 264A and 264B multiply bits b[4] and c[23] together and bits b[5] and c[22] together, respectively. The results of these two ANDing operations are then modulo-2 added together by XOR gate 262C. AND gates 265A and 265B multiply bits b[6] and c[21] together and bits b[7] and c[20] together, respectively. The results of these two ANDing operations are then modulo-2 added together by XOR gate 262D. The outputs of XOR gates 262C and 262D are then modulo-2 added together by XOR gate 269B to produce intermediate result 2. Intermediate results 1 and 2 are then modulo-2 added together by XOR gate 269D to produce result A.

Likewise, AND gates 266A and 266B multiply bits b[8] and c[19] together and bits b[9] and c[18] together, respectively. The results of these two ANDing operations are then modulo-2 added together by XOR gate 262F. AND gates 267A and 267B multiply bits b[11] and c[29] together and bits b[12] and c[27] together, respectively. The results of these two ANDing operations are then modulo-2 added together by XOR gate 262G. The outputs of XOR gates 262F and 262G are then modulo-2 added together by XOR gate 269C to produce intermediate result 3. Bits b[12] and c[27] are multiplied together by AND gate 268A, and the results of that operation are modulo-2 added to intermediate result 3 by XOR gate 269E to produce result B. Results A and B are then modulo-2 added together by XOR gate 269F to produce term d[2].

Figure 14:
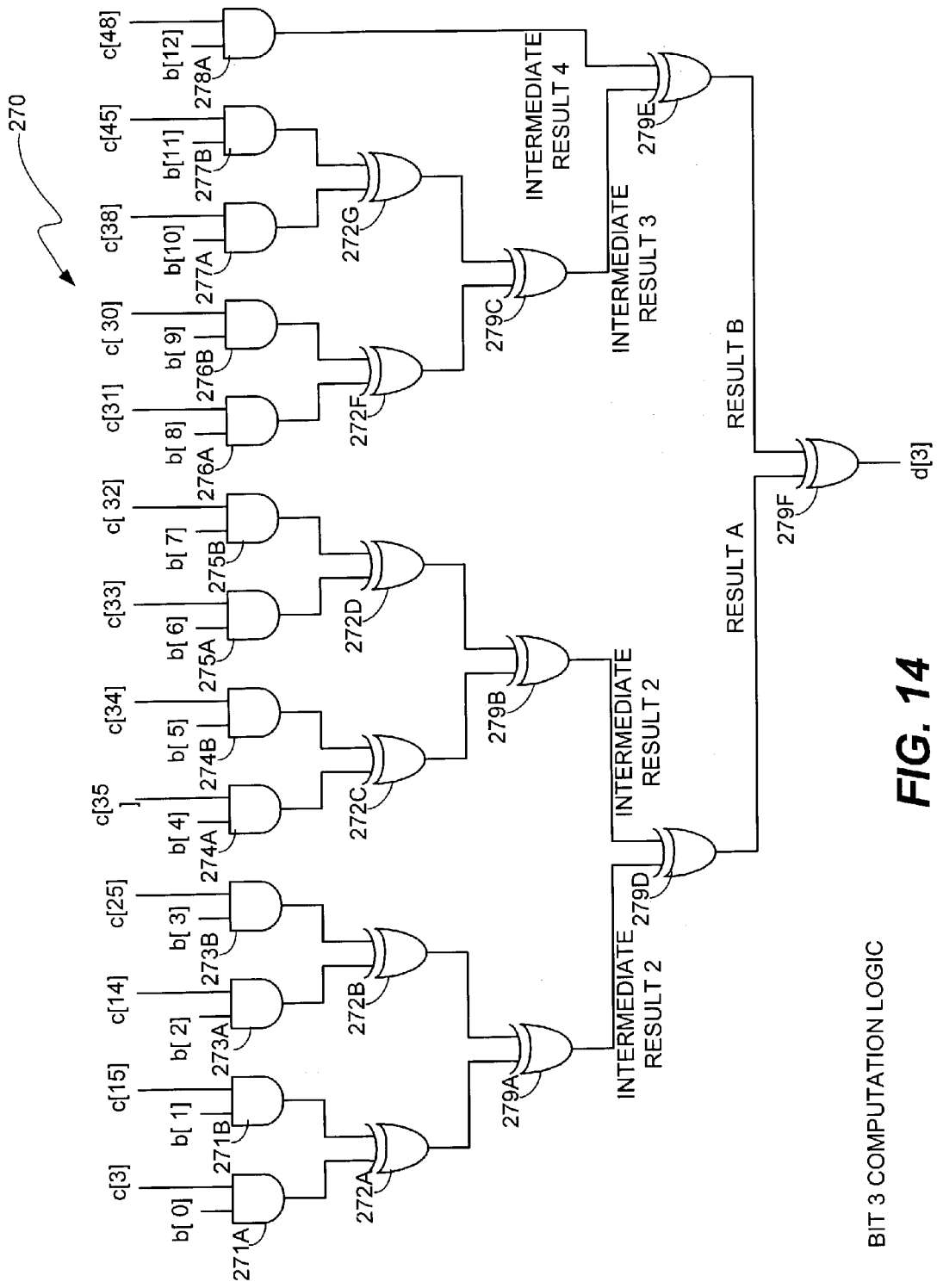
FIG. 14 is a schematic diagram of the binary multiplication and addition logic shown in block diagram form in FIG. 9 for determining bit d[3].

FIG. 14 schematically illustrates the multiplication/addition logic 270 for generating the d[3] term. With reference to FIG. 14, AND gates 271A and 271B multiply bits b[0] and c[3] together and bits b[1] and c[15] together, respectively. The results of these two ANDing operations are then modulo-2 added together by XOR gate 272A. AND gates 273A and 273B multiply bits b[2] and c[14] together and bits b[3] and c[25] together, respectively. The results of these two ANDing operations are then modulo-2 added together by XOR gate 272B. The outputs of XOR gates 272A and 272B are then modulo-2 added together by XOR gate 279A to produce intermediate result 1.

Likewise, AND gates 274A and 274B multiply bits b[4] and c[35] together and bits b[5] and c[34] together, respectively. The results of these two ANDing operations are then modulo-2 added together by XOR gate 272C. AND gates 275A and 275B multiply bits b[6] and c[33] together and bits b[7] and c[32] together, respectively. The results of these two ANDing operations are then modulo-2 added together by XOR gate 272D. The outputs of XOR gates 272C and 272D are then modulo-2 added together by XOR gate 279B to produce intermediate result 2. Intermediate results 1 and 2 are then modulo-2 added together by XOR gate 279D to produce result A.

Likewise, AND gates 276A and 276B multiply bits b[8] and c[31] together and bits b[9] and c[30] together, respectively. The results of these two ANDing operations are then modulo-2 added together by XOR gate 272F. AND gates 277A and 277B multiply bits b[11] and c[45] together and bits b[12] and c[48] together, respectively. The results of these two ANDing operations are then modulo-2 added together by XOR gate 272G. The outputs of XOR gates 272F and 272G are then modulo-2 added together by XOR gate 279C to produce intermediate result 3. Bits b[12] and c[48] are multiplied together by AND gate 278A, and the results of that operation are modulo-2 added to intermediate result 3 by XOR gate 279E to produce result B. Results A and B are then modulo-2 added together by XOR gate 279F to produce term d[3].

Figure 15:
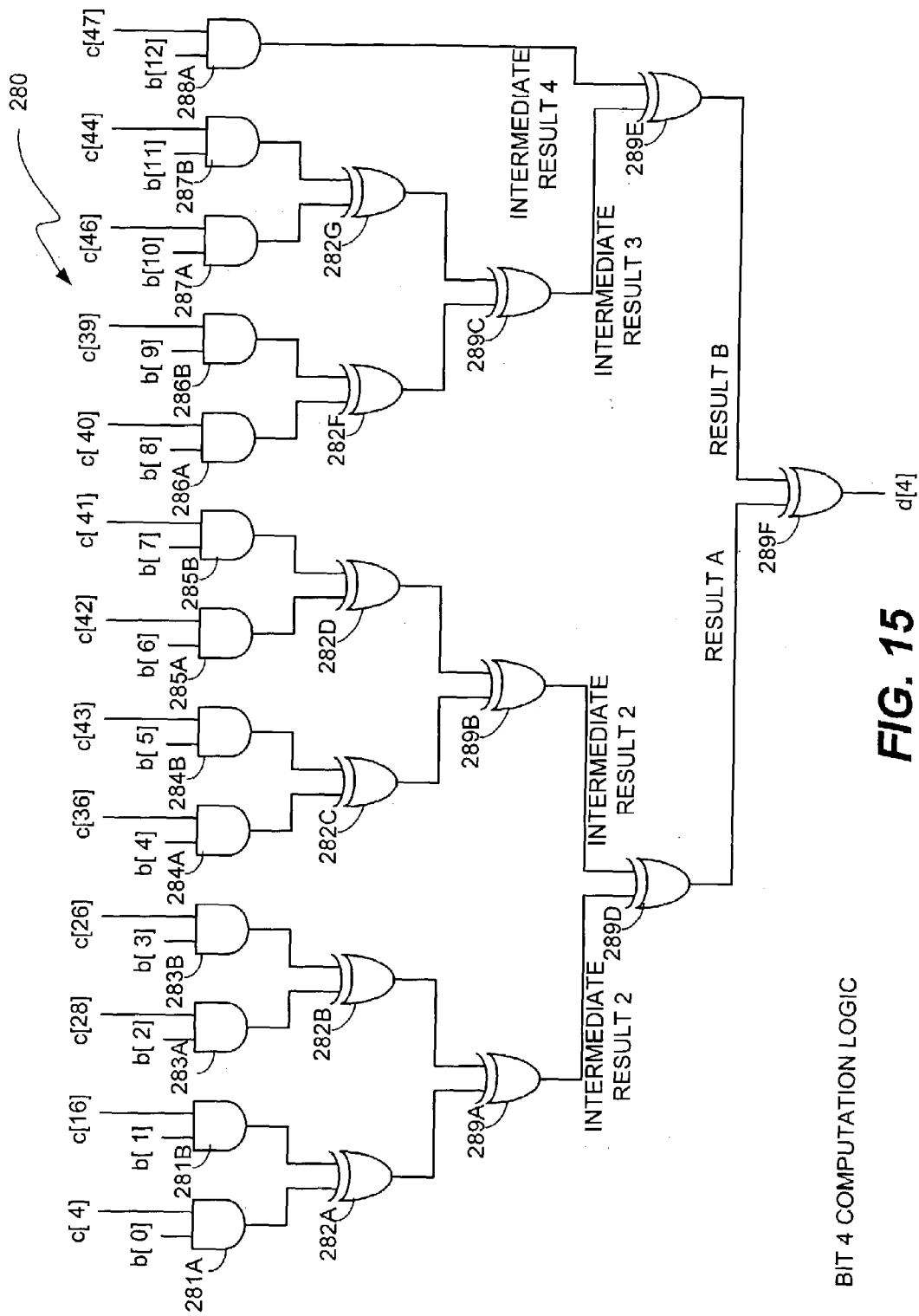
FIG. 15 is a schematic diagram of the binary multiplication and addition logic shown in block diagram form in FIG. 9 for determining bit d[4].

FIG. 15 schematically illustrates the multiplication/addition logic 280 for generating the d[4] term. With reference to FIG. 15, AND gates 281A and 281B multiply bits b[0] and c[4] together and bits b[1] and c[16] together, respectively. The results of these two ANDing operations are then modulo-2 added together by XOR gate 282A. AND gates 283A and 283B multiply bits b[2] and c[28] together and bits b[3] and c[26] together, respectively. The results of these two ANDing operations are then modulo-2 added together by XOR gate 282B. The outputs of XOR gates 282A and 82B are then modulo-2 added together by XOR gate 289A to produce intermediate result 1.

Likewise, AND gates 284A and 284B multiply bits b[4] and c[36] together and bits b[5] and c[43] together, respectively. The results of these two ANDing operations are then modulo-2 added together by XOR gate 82C. AND gates 285A and 285B multiply bits b[6] and c[42] together and bits b[7] and c[41] together, respectively. The results of these two ANDing operations are then modulo-2 added together by XOR gate 282D. The outputs of XOR gates 282C and 282D are then modulo-2 added together by XOR gate 289B to produce intermediate result 2. Intermediate results 1 and 2 are then modulo-2 added together by XOR gate 289D to produce result A.

Likewise, AND gates 286A and 286B multiply bits b[8] and c[40] together and bits b[9] and c[39] together, respectively. The results of these two ANDing operations are then modulo-2 added together by XOR gate 282F. AND gates 287A and 287B multiply bits b[11] and c[44] together and bits b[12] and c[47] together, respectively. The results of these two ANDing operations are then modulo-2 added together by XOR gate 282G. The outputs of XOR gates 282F and 282G are then modulo-2 added together by XOR gate 289C to produce intermediate result 3. Bits b[12] and c[47] are multiplied together by AND gate 288A, and the results of that operation are modulo-2 added to intermediate result 3 by XOR gate 289E to produce result B. Results A and B are then modulo-2 added together by XOR gate 289F to produce term d[4].

Figure 16:
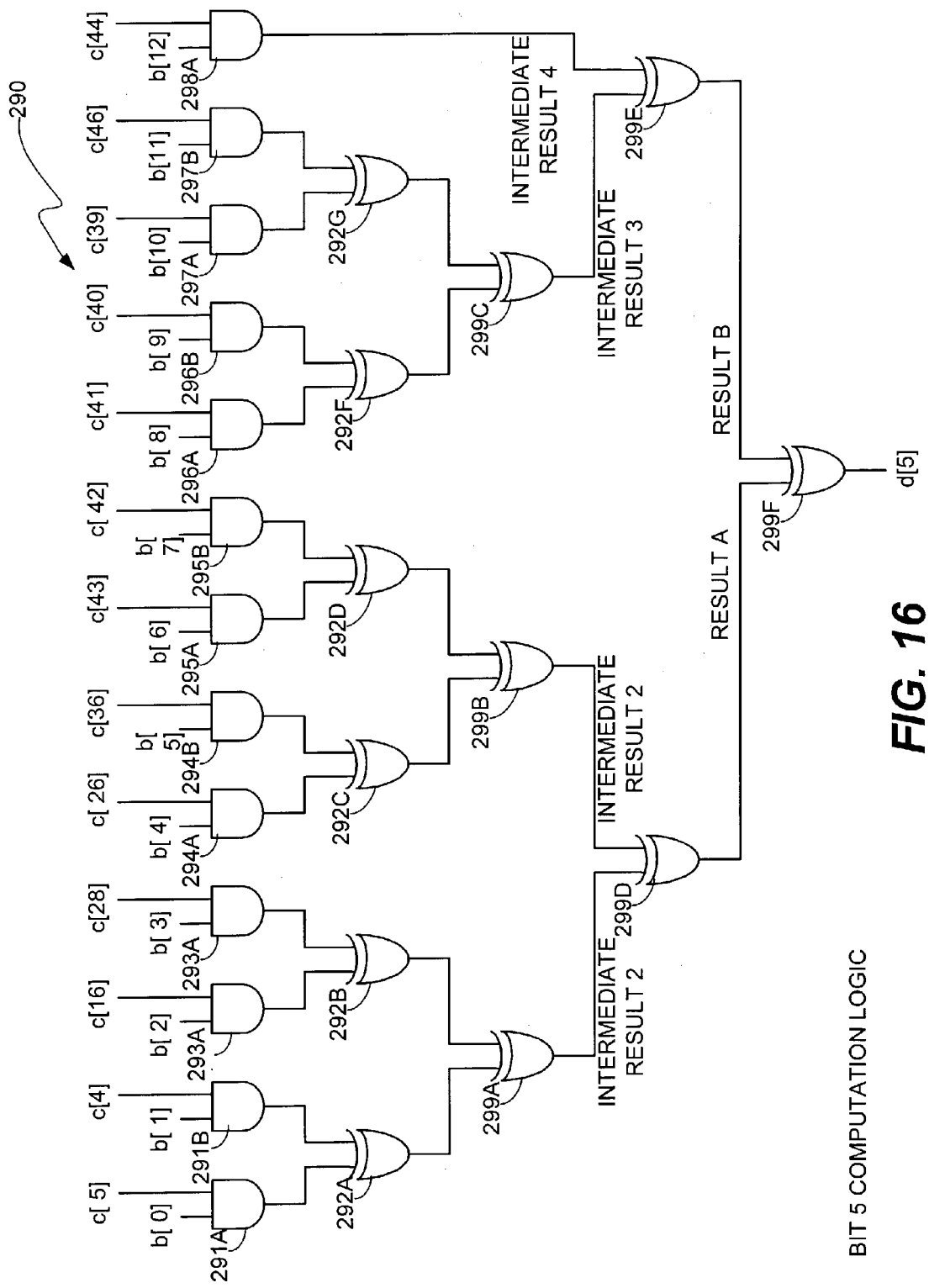
FIG. 16 is a schematic diagram of the binary multiplication and addition logic shown in block diagram form in FIG. 9 for determining bit d[5].

FIG. 16 schematically illustrates the multiplication/addition logic 290 for generating the d[5] term. With reference to FIG. 16, AND gates 291A and 291B multiply bits b[0] and c[5] together and bits b[1] and c[4] together, respectively. The results of these two ANDing operations are then modulo-2 added together by XOR gate 292A. AND gates 293A and 293B multiply bits b[2] and c[16] together and bits b[3] and c[28] together, respectively. The results of these two ANDing operations are then modulo-2 added together by XOR gate 292B. The outputs of XOR gates 292A and 292B are then modulo-2 added together by XOR gate 299A to produce intermediate result 1.

Likewise, AND gates 294A and 294B multiply bits b[4] and c[26] together and bits b[5] and c[36] together, respectively. The results of these two ANDing operations are then modulo-2 added together by XOR gate 292C. AND gates 295A and 295B multiply bits b[6] and c[43] together and bits b[7] and c[42] together, respectively. The results of these two ANDing operations are then modulo-2 added together by XOR gate 292D. The outputs of XOR gates 292C and 292D are then modulo-2 added together by XOR gate 299B to produce intermediate result 2. Intermediate results 1 and 2 are then modulo-2 added together by XOR gate 299D to produce result A.

Likewise, AND gates 296A and 296B multiply bits b[8] and c[41] together and bits b[9] and c[40] together, respectively. The results of these two ANDing operations are then modulo-2 added together by XOR gate 292F. AND gates 297A and 297B multiply bits b[11] and c[46] together and bits b[12] and c[44] together, respectively. The results of these two ANDing operations are then modulo-2 added together by XOR gate 292G. The outputs of XOR gates 292F and 292G are then modulo-2 added together by XOR gate 299C to produce intermediate result 3. Bits b[12] and c[44] are multiplied together by AND gate 298A, and the results of that operation are modulo-2 added to intermediate result 3 by XOR gate 299E to produce result B. Results A and B are then modulo-2 added together by XOR gate 299F to produce term d[5].

Figure 17:
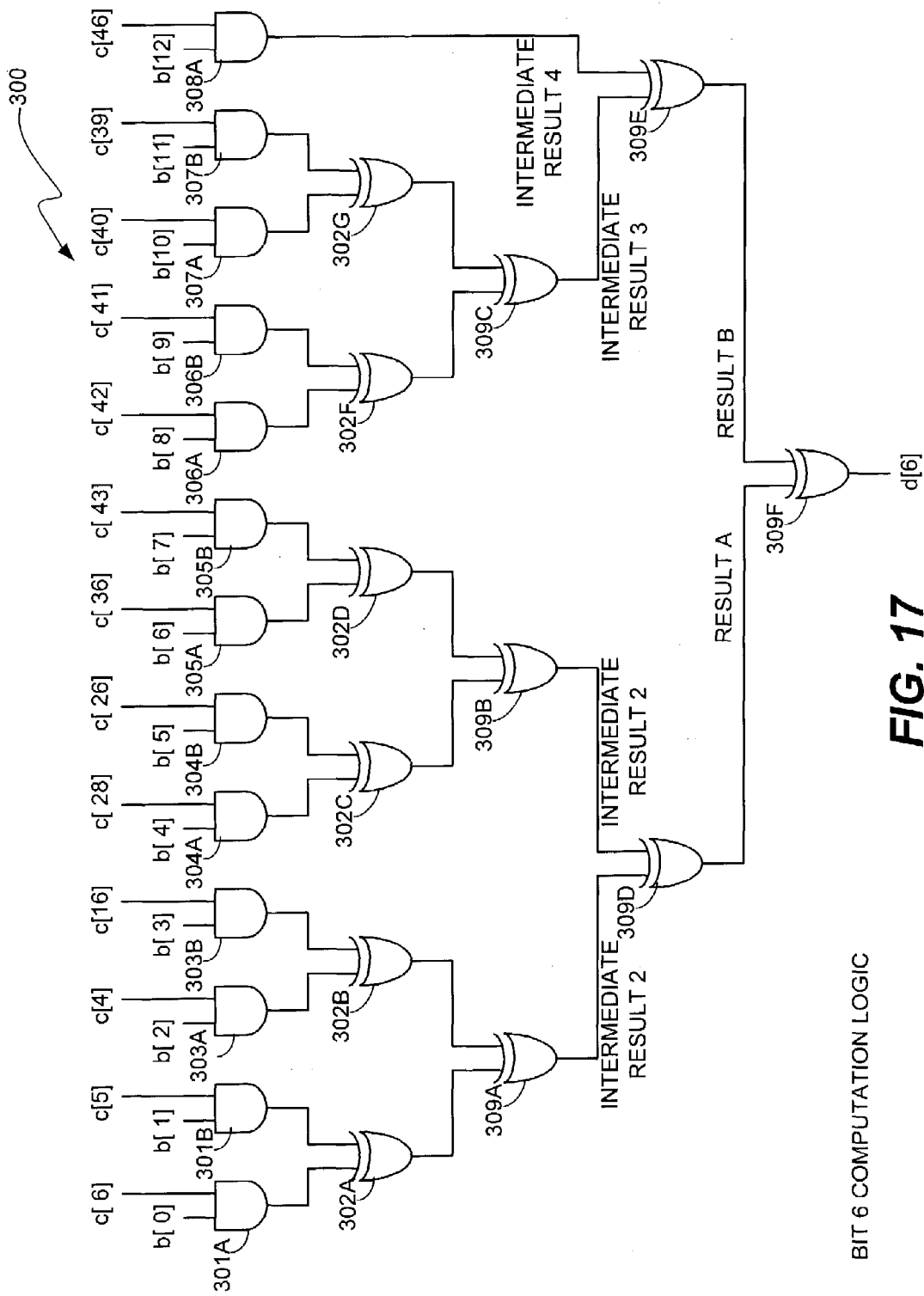
FIG. 17 is a schematic diagram of the binary multiplication and addition logic shown in block diagram form in FIG. 9 for determining bit d[6].

FIG. 17 schematically illustrates the multiplication/addition logic 300 for generating the d[6] term. With reference to FIG. 17, AND gates 301A and 301B multiply bits b[0] and c[6] together and bits b[1] and c[5] together, respectively. The results of these two ANDing operations are then modulo-2 added together by XOR gate 302A. AND gates 303A and 303B multiply bits b[2] and c[4] together and bits b[3] and c[16] together, respectively. The results of these two ANDing operations are then modulo-2 added together by XOR gate 302B. The outputs of XOR gates 302A and 302B are then modulo-2 added together by XOR gate 309A to produce intermediate result 1.

Likewise, AND gates 304A and 304B multiply bits b[4] and c[28] together and bits b[5] and c[26] together, respectively. The results of these two ANDing operations are then modulo-2 added together by XOR gate 302C. AND gates 305A and 305B multiply bits b[6] and c[36] together and bits b[7] and c[43] together, respectively. The results of these two ANDing operations are then modulo-2 added together by XOR gate 302D. The outputs of XOR gates 302C and 302D are then modulo-2 added together by XOR gate 309B to produce intermediate result 2. Intermediate results 1 and 2 are then modulo-2 added together by XOR gate 309D to produce result A.

Likewise, AND gates 306A and 306B multiply bits b[8] and c[42] together and bits b[9] and c[41] together, respectively. The results of these two ANDing operations are then modulo-2 added together by XOR gate 302F. AND gates 307A and 307B multiply bits b[11] and c[39] together and bits b[12] and c[46] together, respectively. The results of these two ANDing operations are then modulo-2 added together by XOR gate 302G. The outputs of XOR gates 302F and 302G are then modulo-2 added together by XOR gate 309C to produce intermediate result 3. Bits b[12] and c[46] are multiplied together by AND gate 308A, and the results of that operation are modulo-2 added to intermediate result 3 by XOR gate 309E to produce result B. Results A and B are then modulo-2 added together by XOR gate 309F to produce term d[6].

Figure 18:
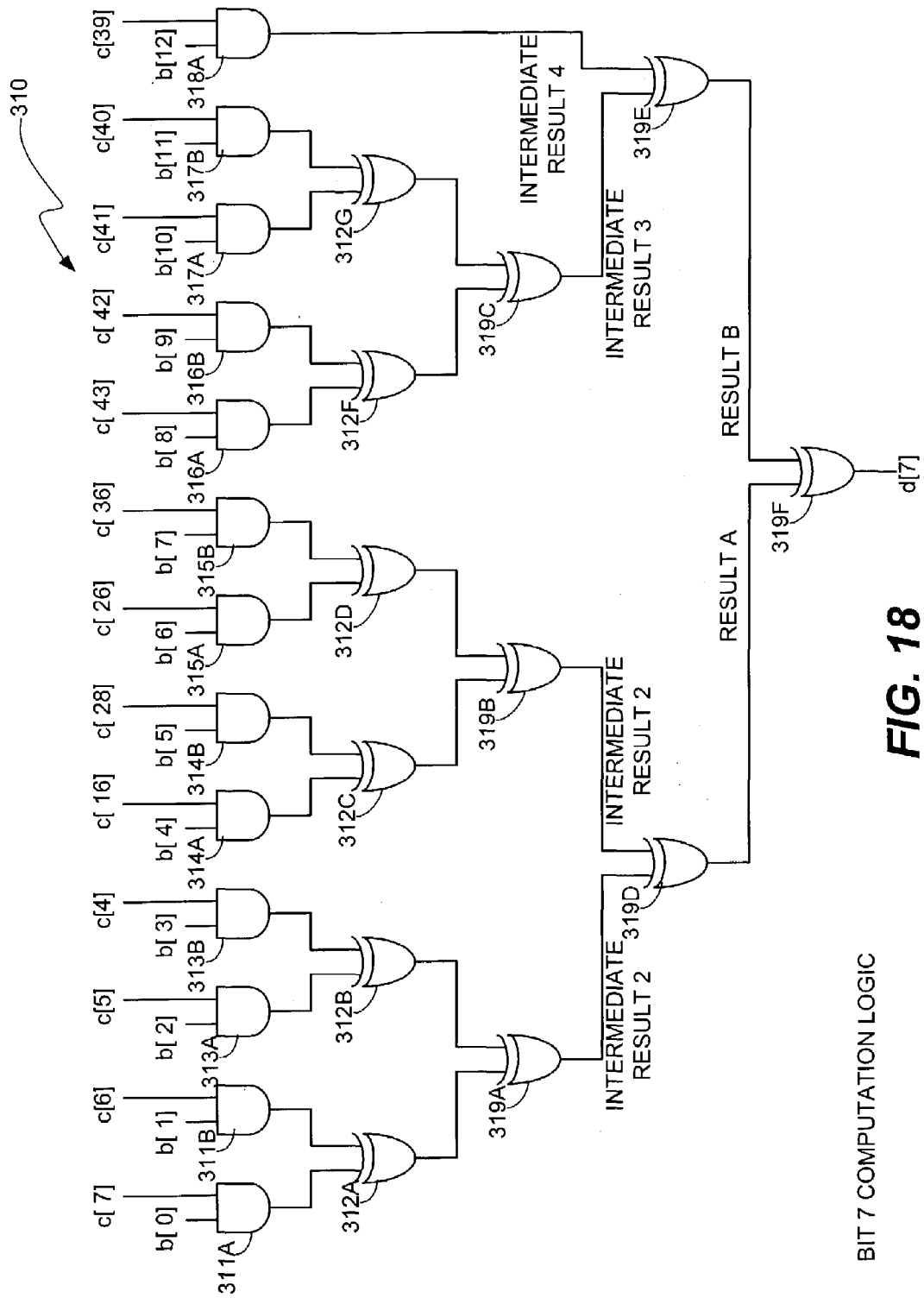
FIG. 18 is a schematic diagram of the binary multiplication and addition logic shown in block diagram form in FIG. 9 for determining bit d[7].

FIG. 18 schematically illustrates the multiplication/addition logic 310 for generating the d[7] term. With reference to FIG. 18, AND gates 311A and 311B multiply bits b[0] and c[7] together and bits b[1] and c[6] together, respectively. The results of these two ANDing operations are then modulo-2 added together by XOR gate 312A. AND gates 113A and 113B multiply bits b[2] and c[5] together and bits b[3] and c[4] together, respectively. The results of these two ANDing operations are then modulo-2 added together by XOR gate 312B. The outputs of XOR gates 312A and 312B are then modulo-2 added together by XOR gate 319A to produce intermediate result 1.

Likewise, AND gates 314A and 314B multiply bits b[4] and c[16] together and bits b[5] and c[28] together, respectively. The results of these two ANDing operations are then modulo-2 added together by XOR gate 312C. AND gates 315A and 315B multiply bits b[6] and c[26] together and bits b[7] and c[36] together, respectively. The results of these two ANDing operations are then modulo-2 added together by XOR gate 312D. The outputs of XOR gates 312C and 312D are then modulo-2 added together by XOR gate 319B to produce intermediate result 2. Intermediate results 1 and 2 are then modulo-2 added together by XOR gate 319D to produce result A.

Likewise, AND gates 316A and 316B multiply bits b[8] and c[43] together and bits b[9] and c[42] together, respectively. The results of these two ANDing operations are then modulo-2 added together by XOR gate 312F. AND gates 317A and 317B multiply bits b[11] and c[40] together and bits b[12] and c[39] together, respectively. The results of these two ANDing operations are then modulo-2 added together by XOR gate 312G. The outputs of XOR gates 312F and 312G are then modulo-2 added together by XOR gate 319C to produce intermediate result 3. Bits b[12] and c[46] are multiplied together by AND gate 318A, and the results of that operation are modulo-2 added to intermediate result 3 by XOR gate 319E to produce result B. Results A and B are then modulo-2 added together by XOR gate 319F to produce term d[7].

Figure 19:
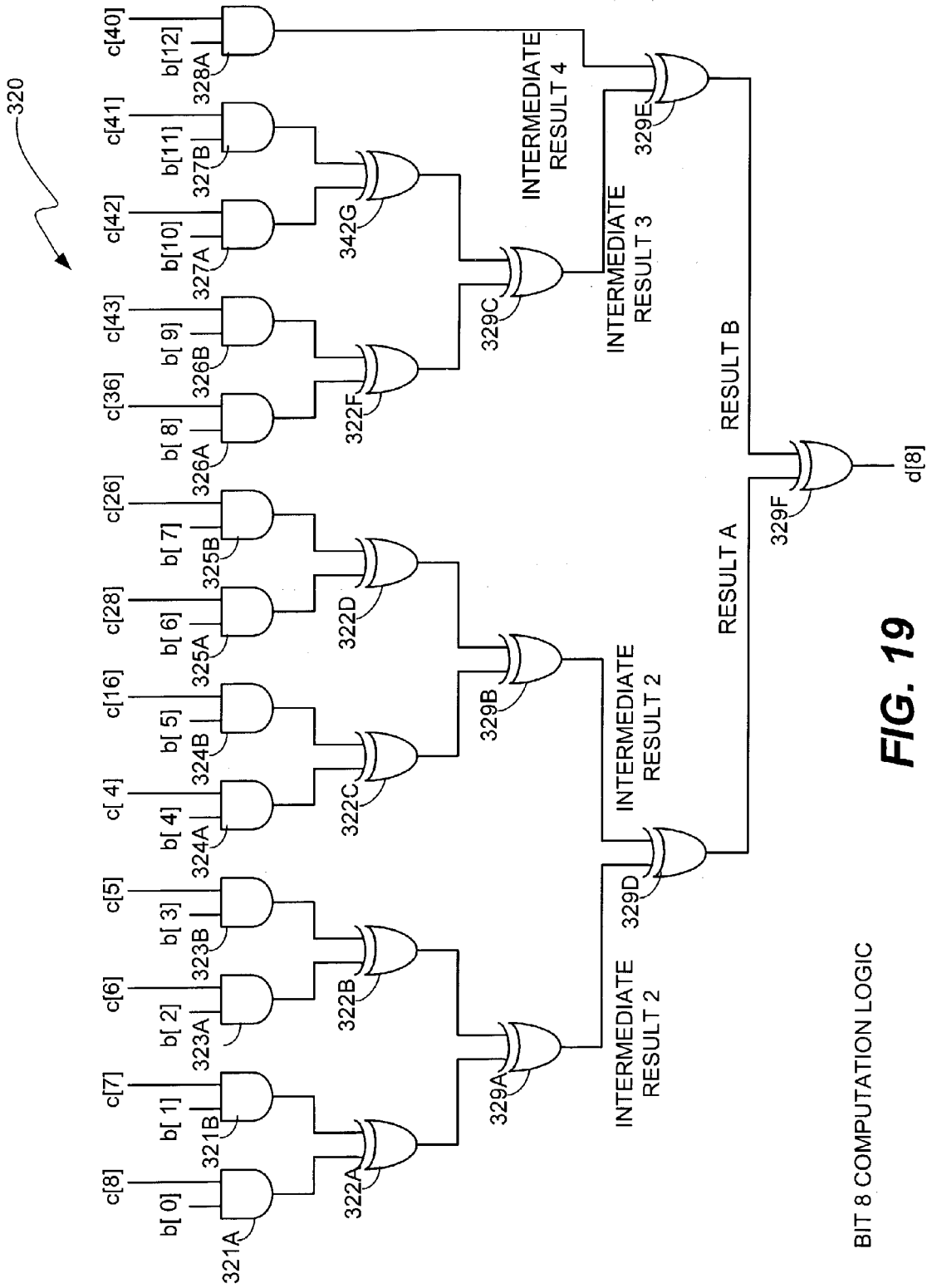
FIG. 19 is a schematic diagram of the binary multiplication and addition logic shown in block diagram form in FIG. 9 for determining bit d[8].

FIG. 19 schematically illustrates the multiplication/addition logic 120 for generating the d[8] term. With reference to FIG. 19, AND gates 321A and 321B multiply bits b[0] and c[8] together and bits b[1] and c[7] together, respectively. The results of these two ANDing operations are then modulo-2 added together by XOR gate 322A. AND gates 323A and 323B multiply bits b[2] and c[6] together and bits b[3] and c[5] together, respectively. The results of these two ANDing operations are then modulo-2 added together by XOR gate 322B. The outputs of XOR gates 322A and 322B are then modulo-2 added together by XOR gate 329A to produce intermediate result 1.

Likewise, AND gates 324A and 324B multiply bits b[4] and c[4] together and bits b[5] and c[16] together, respectively. The results of these two ANDing operations are then modulo-2 added together by XOR gate 122C. AND gates 325A and 325B multiply bits b[6] and c[28] together and bits b[7] and c[26] together, respectively. The results of these two ANDing operations are then modulo-2 added together by XOR gate 322D. The outputs of XOR gates 322C and 322D are then modulo-2 added together by XOR gate 129B to produce intermediate result 2. Intermediate results 1 and 2 are then modulo-2 added together by XOR gate 329D to produce result A.

Likewise, AND gates 326A and 326B multiply bits b[8] and c[36] together and bits b[9] and c[43] together, respectively. The results of these two ANDing operations are then modulo-2 added together by XOR gate 322F. AND gates 327A and 327B multiply bits b[11] and c[41] together and bits b[12] and c[40] together, respectively. The results of these two ANDing operations are then modulo-2 added together by XOR gate 322G. The outputs of XOR gates 322F and 322G are then modulo-2 added together by XOR gate 329C to produce intermediate result 3. Bits b[12] and c[40] are multiplied together by AND gate 328A, and the results of that operation are modulo-2 added to intermediate result 3 by XOR gate 329E to produce result B. Results A and B are then modulo-2 added together by XOR gate 329F to produce term d[8].

Figure 20:
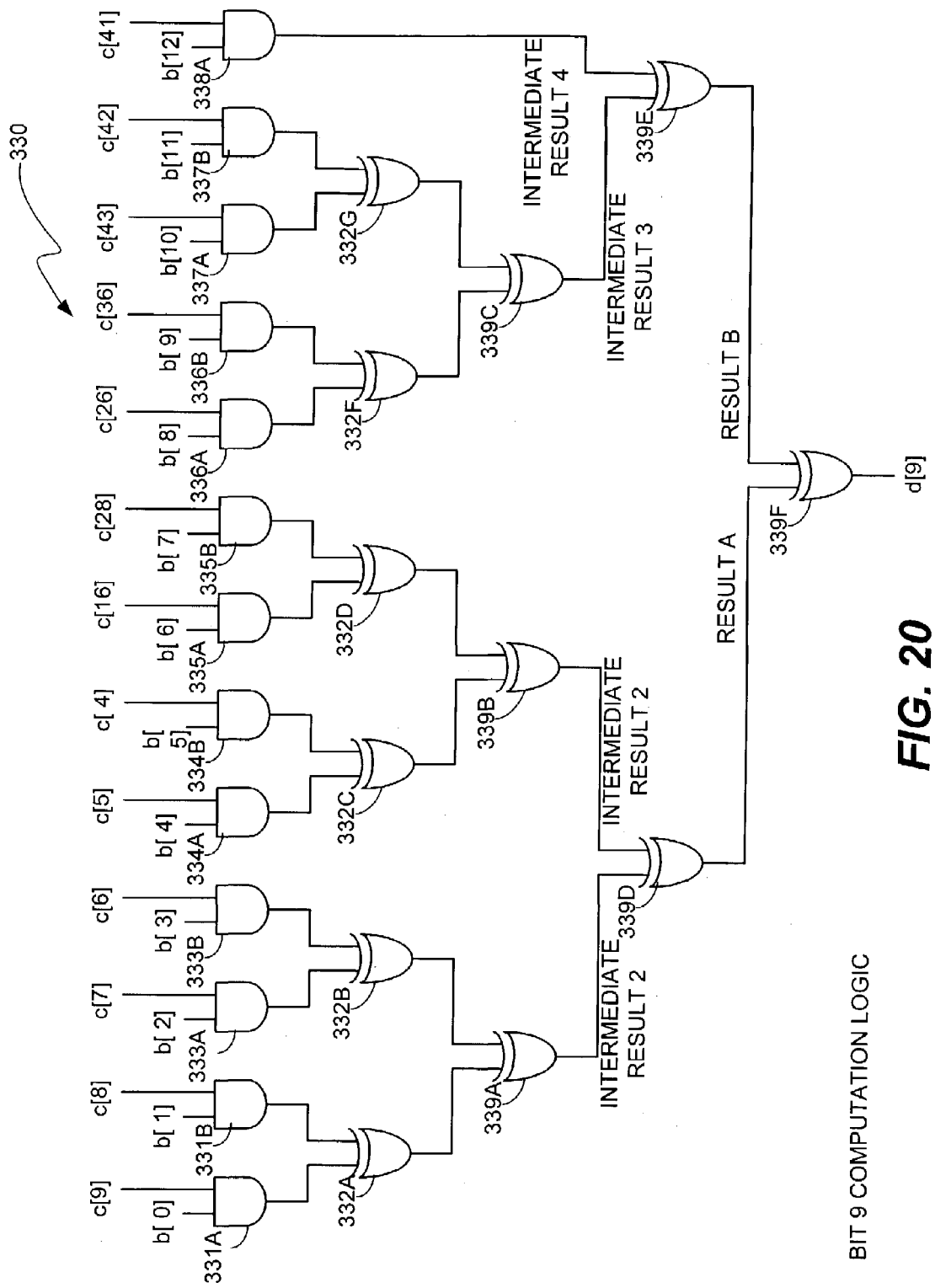
FIG. 20 is a schematic diagram of the binary multiplication and addition logic shown in block diagram form in FIG. 9 for determining bit d[9].

FIG. 20 schematically illustrates the multiplication/addition logic 330 for generating the d[9] term. With reference to FIG. 20, AND gates 331A and 331B multiply bits b[0] and c[9] together and bits b[1] and c[8] together, respectively. The results of these two ANDing operations are then modulo-2 added together by XOR gate 332A. AND gates 333A and 333B multiply bits b[2] and c[7] together and bits b[3] and c[6] together, respectively. The results of these two ANDing operations are then modulo-2 added together by XOR gate 332B. The outputs of XOR gates 332A and 332B are then modulo-2 added together by XOR gate 339A to produce intermediate result 1.

Likewise, AND gates 334A and 334B multiply bits b[4] and c[5] together and bits b[5] and c[4] together, respectively. The results of these two ANDing operations are then modulo-2 added together by XOR gate 332C. AND gates 335A and 335B multiply bits b[6] and c[16] together and bits b[7] and c[28] together, respectively. The results of these two ANDing operations are then modulo-2 added together by XOR gate 332D. The outputs of XOR gates 332C and 332D are then modulo-2 added together by XOR gate 339B to produce intermediate result 2. Intermediate results 1 and 2 are then modulo-2 added together by XOR gate 339D to produce result A.

Likewise, AND gates 336A and 336B multiply bits b[8] and c[26] together and bits b[9] and c[36] together, respectively. The results of these two ANDing operations are then modulo-2 added together by XOR gate 332F. AND gates 337A and 337B multiply bits b[11] and c[42] together and bits b[12] and c[41] together, respectively. The results of these two ANDing operations are then modulo-2 added together by XOR gate 332G. The outputs of XOR gates 332F and 332G are then modulo-2 added together by XOR gate 339C to produce intermediate result 3. Bits b[12] and c[42] are multiplied together by AND gate 338A, and the results of that operation are modulo-2 added to intermediate result 3 by XOR gate 339E to produce result B. Results A and B are then modulo-2 added together by XOR gate 339F to produce term d[9].

Figure 21:
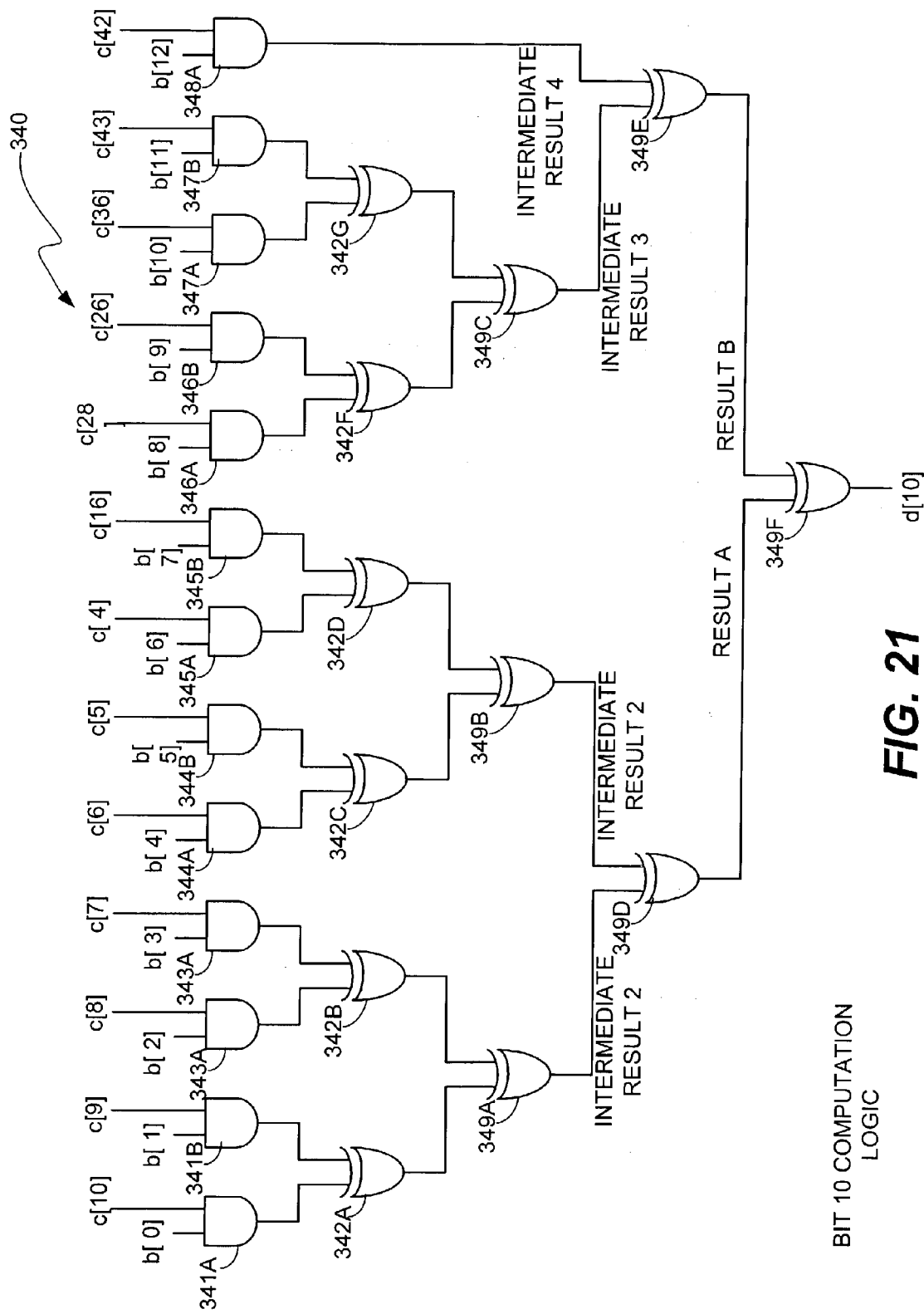
FIG. 21 is a schematic diagram of the binary multiplication and addition logic shown in block diagram form in FIG. 9 for determining bit d[10].

FIG. 21 schematically illustrates the multiplication/addition logic 340 for generating the d[10] term. With reference to FIG. 21, AND gates 341A and 341B multiply bits b[0] and c[10] together and bits b[1] and c[9] together, respectively. The results of these two ANDing operations are then modulo-2 added together by XOR gate 342A. AND gates 343A and 343B multiply bits b[2] and c[8] together and bits b[3] and c[7] together, respectively. The results of these two ANDing operations are then modulo-2 added together by XOR gate 342B. The outputs of XOR gates 342A and 342B are then modulo-2 added together by XOR gate 349A to produce intermediate result 1.

Likewise, AND gates 344A and 344B multiply bits b[4] and c[6] together and bits b[5] and c[5] together, respectively. The results of these two ANDing operations are then modulo-2 added together by XOR gate 342C. AND gates 345A and 345B multiply bits b[6] and c[4] together and bits b[7] and c[16] together, respectively. The results of these two ANDing operations are then modulo-2 added together by XOR gate 342D. The outputs of XOR gates 342C and 342D are then modulo-2 added together by XOR gate 349B to produce intermediate result 2. Intermediate results 1 and 2 are then modulo-2 added together by XOR gate 349D to produce result A.

Likewise, AND gates 346A and 346B multiply bits b[8] and c[28] together and bits b[9] and c[26] together, respectively. The results of these two ANDing operations are then modulo-2 added together by XOR gate 342F. AND gates 347A and 347B multiply bits b[11] and c[43] together and bits b[12] and c[42] together, respectively. The results of these two ANDing operations are then modulo-2 added together by XOR gate 342G. The outputs of XOR gates 342F and 342G are then modulo-2 added together by XOR gate 349C to produce intermediate result 3. Bits b[12] and c[42] are multiplied together by AND gate 348A, and the results of that operation are modulo-2 added to intermediate result 3 by XOR gate 349E to produce result B. Results A and B are then modulo-2 added together by XOR gate 349F to produce term d[10].

Figure 22:
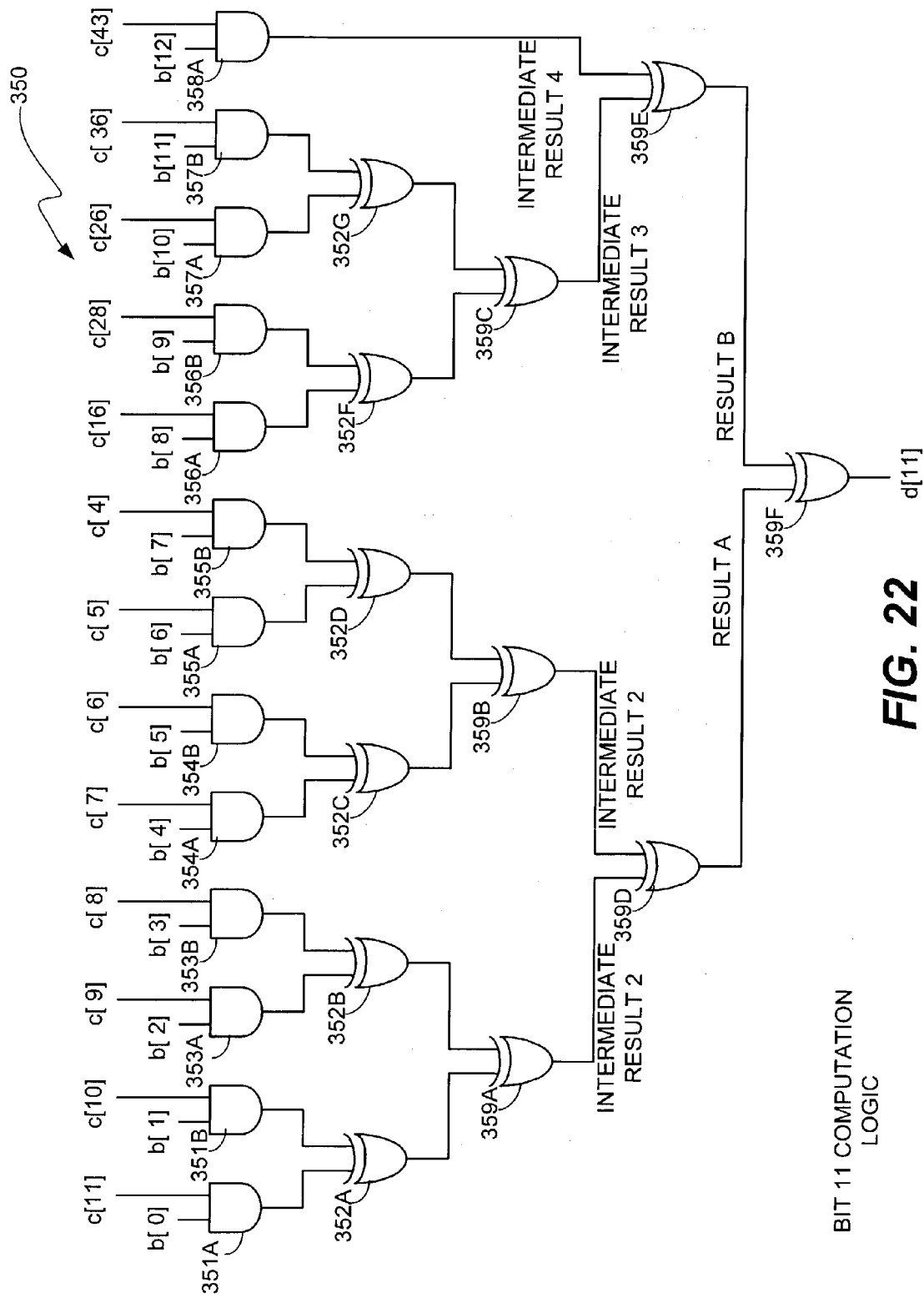
FIG. 22 is a schematic diagram of the binary multiplication and addition logic shown in block diagram form in FIG. 9 for determining bit d[11].

FIG. 22 schematically illustrates the multiplication/addition logic 350 for generating the d[11] term. With reference to FIG. 22, AND gates 351A and 351B multiply bits b[0] and c[11] together and bits b[1] and c[10] together, respectively. The results of these two ANDing operations are then modulo-2 added together by XOR gate 352A. AND gates 353A and 353B multiply bits b[2] and c[9] together and bits b[3] and c[8] together, respectively. The results of these two ANDing operations are then modulo-2 added together by XOR gate 352B. The outputs of XOR gates 352A and 352B are then modulo-2 added together by XOR gate 359A to produce intermediate result 1.

Likewise, AND gates 354A and 354B multiply bits b[4] and c[7] together and bits b[5] and c[6] together, respectively. The results of these two ANDing operations are then modulo-2 added together by XOR gate 352C. AND gates 355A and 355B multiply bits b[6] and c[5] together and bits b[7] and c[4] together, respectively. The results of these two ANDing operations are then modulo-2 added together by XOR gate 352D. The outputs of XOR gates 352C and 352D are then modulo-2 added together by XOR gate 359B to produce intermediate result 2. Intermediate results 1 and 2 are then modulo-2 added together by XOR gate 359D to produce result A.

Likewise, AND gates 356A and 356B multiply bits b[8] and c[16] together and bits b[9] and c[28] together, respectively. The results of these two ANDing operations are then modulo-2 added together by XOR gate 352F. AND gates 357A and 357B multiply bits b[11] and c[36] together and bits b[12] and c[43] together, respectively. The results of these two ANDing operations are then modulo-2 added together by XOR gate 352G. The outputs of XOR gates 352F and 352G are then modulo-2 added together by XOR gate 359C to produce intermediate result 3. Bits b[12] and c[43] are multiplied together by AND gate 358A, and the results of that operation are modulo-2 added to intermediate result 3 by XOR gate 359E to produce result B. Results A and B are then modulo-2 added together by XOR gate 359F to produce term d[11].

Figure 23:
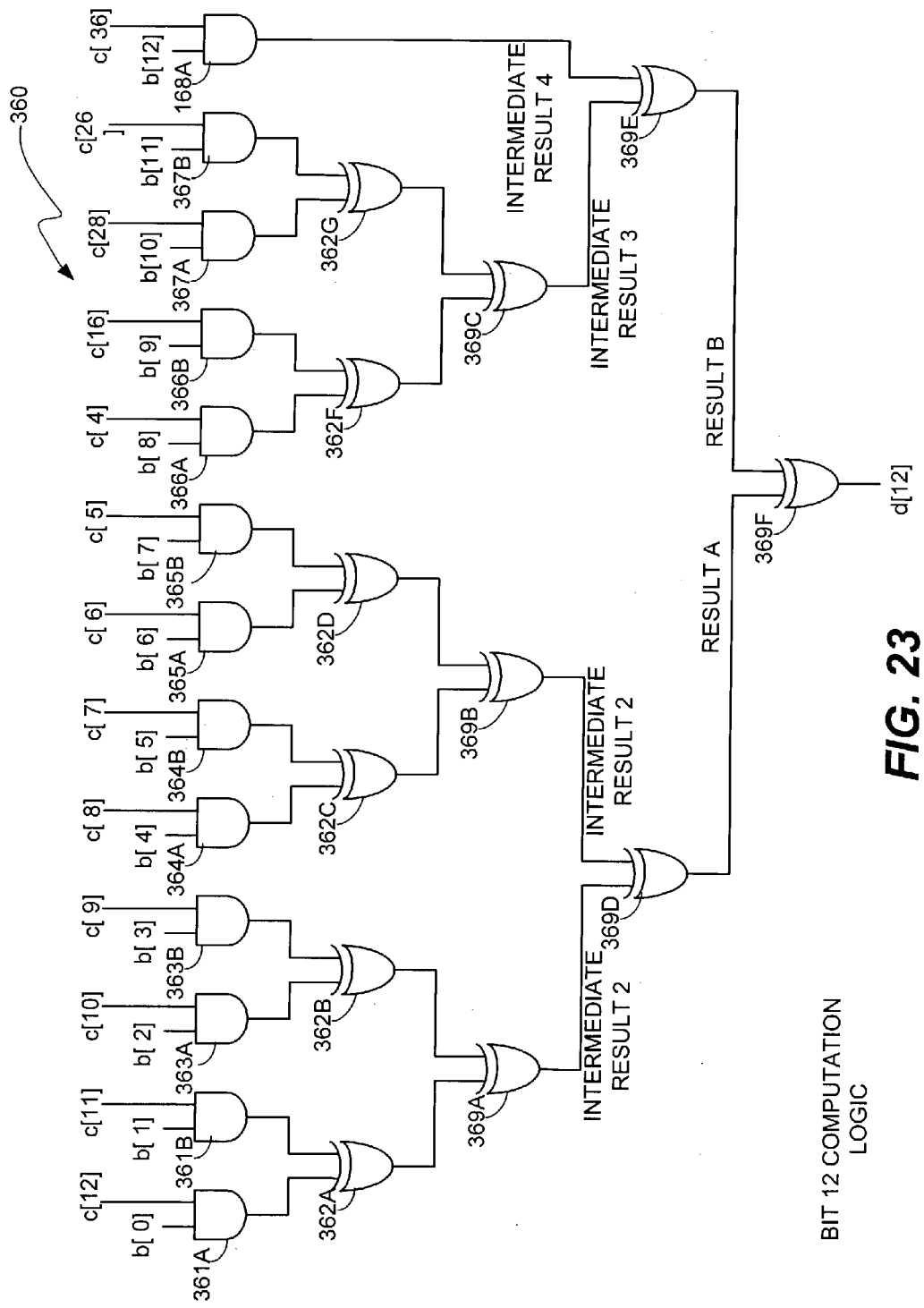
FIG. 23 is a schematic diagram of the binary multiplication and addition logic shown in block diagram form in FIG. 9 for determining bit d[12].
Figure 24:
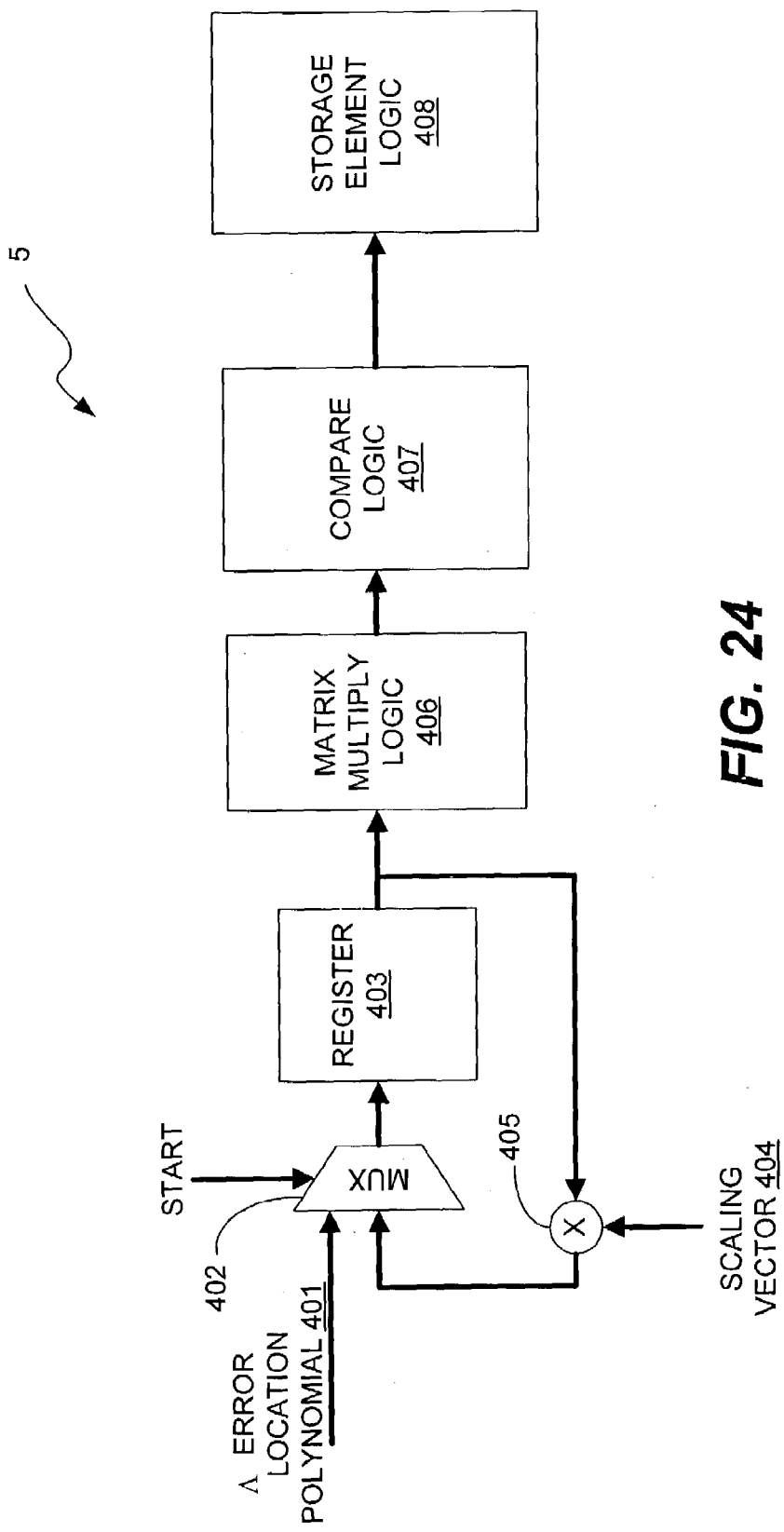
FIG. 24 is a block diagram of the Chien search logic block of FIG. 1.

FIG. 23 schematically illustrates the multiplication/addition logic 360 for generating the d[12] term. With reference to FIG. 24, AND gates 361A and 361B multiply bits b[0] and c[11] together and bits b[1] and c[10] together, respectively. The results of these two ANDing operations are then modulo-2 added together by XOR gate 362A. AND gates 363A and 363B multiply bits b[2] and c[9] together and bits b[3] and c[8] together, respectively. The results of these two ANDing operations are then modulo-2 added together by XOR gate 362B. The outputs of XOR gates 362A and 342B are then modulo-2 added together by XOR gate 369A to produce intermediate result 1.

Likewise, AND gates 364A and 364B multiply bits b[4] and c[7] together and bits b[5] and c[6] together, respectively. The results of these two ANDing operations are then modulo-2 added together by XOR gate 362C. AND gates 365A and 365B multiply bits b[6] and c[5] together and bits b[7] and c[4] together, respectively. The results of these two ANDing operations are then modulo-2 added together by XOR gate 362D. The outputs of XOR gates 362C and 362D are then modulo-2 added together by XOR gate 369B to produce intermediate result 2. Intermediate results 1 and 2 are then modulo-2 added together by XOR gate 369D to produce result A.

Likewise, AND gates 366A and 366B multiply bits b[8] and c[16] together and bits b[9] and c[28] together, respectively. The results of these two ANDing operations are then modulo-2 added together by XOR gate 362F. AND gates 367A and 367B multiply bits b[11] and c[36] together and bits b[12] and c[43] together, respectively. The results of these two ANDing operations are then modulo-2 added together by XOR gate 362G. The outputs of XOR gates 362F and 362G are then modulo-2 added together by XOR gate 369C to produce intermediate result 3. Bits b[12] and c[43] are multiplied together by AND gate 368A, and the results of that operation are modulo-2 added to intermediate result 3 by XOR gate 369E to produce result B. Results A and B are then modulo-2 added together by XOR gate 369F to produce term d[12].

This example embodiment of the present invention provides a $GF(2^{13})$ Galois Field Multiplier that is implemented using only 169 2-input AND gates and 195 2-input XOR gates. As stated above, the present invention is not limited to any particular configuration, and is not limited to any particular size Galois field. Also, those skilled in the art will understand that logical operations performed by the AND gates and XOR gates discussed herein can be performed using equivalent logic, such as, for example, NAND gates and XNOR gates.

Chien Search Logic

The Chien search logic 5 shown in block diagram form in FIG. 1 will now be described in detail with reference to the preferred embodiment shown in FIGS. 24–26. With reference to FIG. 24, the Chien search logic 5, receives the 39 13-bit Λ coefficients from the error location polynomial storage logic 123 shown in FIG. 5. When the coefficients Λ[i] through Λ[39] are received, the "START" signal is asserted and the coefficients are selected by multiplexer 402 and stored in register 403. Then, the coefficients are output from the register 403 and multiplied by a scaling vector 404 by multiplier logic 405. In accordance with the present invention, it was determined that multiplying the Λ coefficients by this scaling vector 404 makes it possible to use constant coefficients in the matrix multiply logic 406. This enables a relatively small amount of logic to be used to perform the matrix multiplication operations of the Chien search algorithm. The Chien search algorithm logic 5 of the present invention is configured to perform many matrix multiply operations in parallel, which enables the Chien search algorithm to be executed very quickly to locate the bit errors in the error locator polynomial 401. Such a large number of matrix multiply operations would normally require a very large number of gates. However, the constant coefficient matrix multiply logic 406 of the present invention that is made possible by the aforementioned vector scaling of the present invention significantly limits the amount of logic needed to perform the matrix multiply operations.

Therefore, it can be seen that the present invention enables very high-speed throughput with respect to error correction, and does so using a relatively small amount of logic. This renders the decoder 1 (FIG. 1) of the present invention suitable for use in high data rate systems. Furthermore, the use of a relatively small amount of logic limits area and power consumption requirements. Once the Λ coefficients have been scaled and stored in register 403, "START" is deasserted and the matrix multiply operations are performed on the scaled coefficients by the constant-coefficient matrix multiply logic 406. The matrix multiply operations utilize a partial matrix and, as stated above, the coefficients of the matrix are constant, thus eliminating the need to store a large number of matrix coefficients and to update the values of the matrix coefficients.

Compare logic 407 receives the output from the matrix multiply logic 406 and compares each output value with 1 (or adds 1 to the output value and compares with zero) to determine whether the output value is a 1 or a 0 and outputs an error vector. In accordance with the example embodiment, the error vector is 32 bits in width and a 1 in the error vector represents an error. The 32-bit error vector is stored in the storage element logic 408. After 240 iterations of the Chien search algorithm, 240 32-bit error vectors are contained in the storage element logic 408, which corresponds to the size of the entire code word in the example embodiment. As stated above with reference to FIG. 1, the bits output from the Chien search logic 5 are XORed with respective bits of the delayed code word by error correction logic 6 to correct the errors in the code word. In accordance with the example embodiment, the Chien search algorithm checks the entire 7680-bit code word for errors in 240 cycles.

Figure 25:
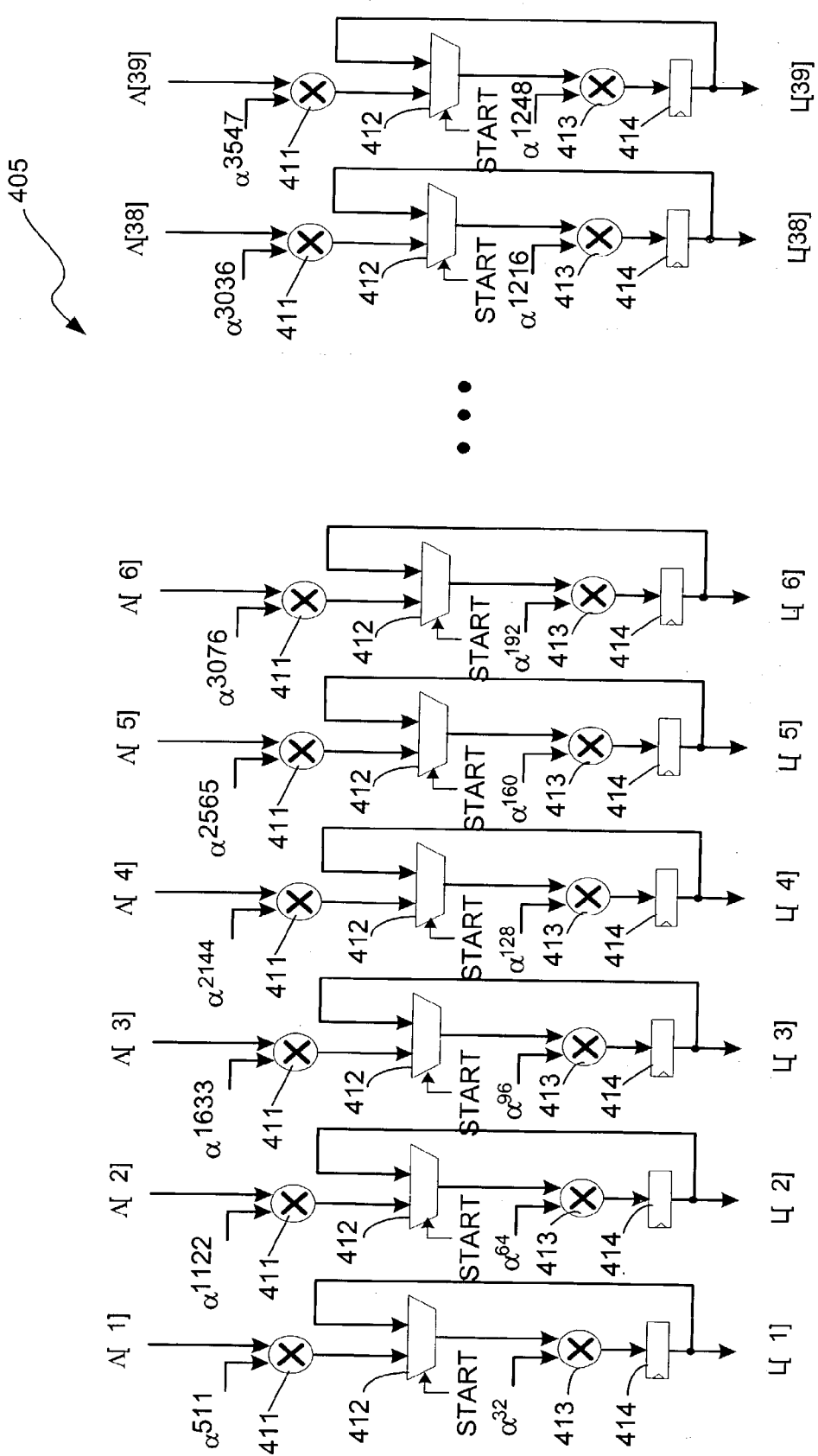
FIG. 25 is a schematic diagram of the scaling multiplier logic of FIG. 24.
Figure 26:
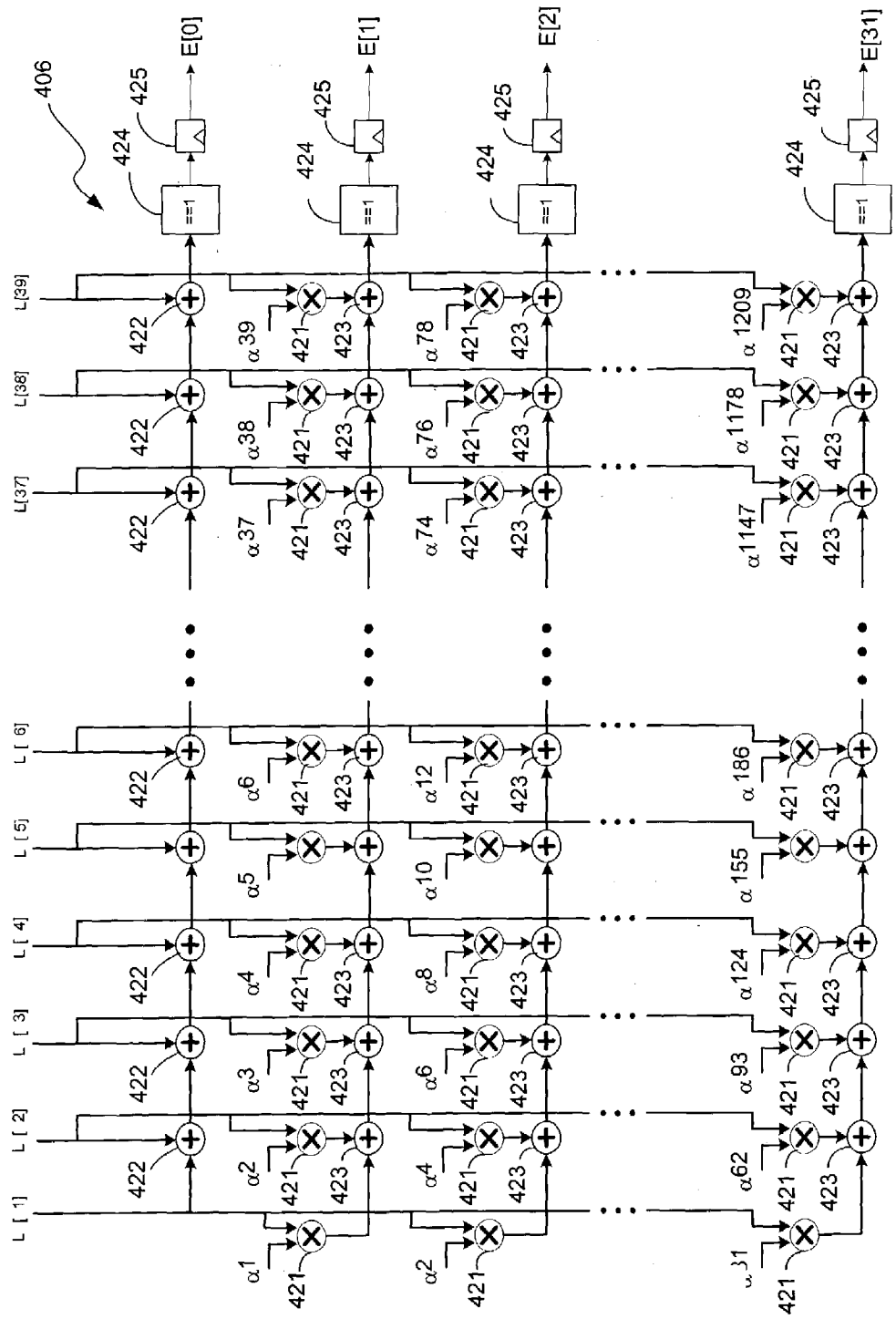
FIG. 26 is a schematic diagram of the matrix multiplier logic of FIG. 24.

FIG. 25 is a schematic diagram of the scaling multiplier logic 405 shown in block diagram form in FIG. 24. In accordance with the preferred embodiment, the scaling logic 405 scales the 39 13-bit error locator polynomial coefficients simultaneously in parallel. Each respective Λ coefficient is initially multiplied by a first set of respective alpha matrix coefficients by first multiplier logic 411. At this time, "START" is asserted, and the scaled values are selected by multiplexer 412. The scaled values are then multiplied by a second set of alpha values by second multiplier logic 413 and stored in register logic 414. After this initial scaling, "START" is deasserted and the stored values are selected by multiplexer logic 412, multiplied again by the second multiplier logic 413 and stored in register logic 414. The values stored in the register logic 414 at this time, L[1] through L[39], are the values that are operated on by the matrix multiply logic 406, which will now be discussed with reference to the schematic diagram of shown in FIG. 25.

The constant coefficient partial matrix in accordance with this example embodiment has only 32 rows, as indicated by the 32 multipliers 421, which multiply respective alpha coefficients by respective scaled outputs. Adder logic XORs the scaled values together before the scaled values are multiplied by the matrix coefficients, as indicated by the top row of adders 422. After the scaled values have been multiplied by the multiplier logic 421 in each row, the resulting products are XORed together as indicated by adder logic 423 in each of the rows. The final results of the XOR operations in each row are then compared to 1 by comparator logic 424 and outputs either a 1 or a 0 depending on the results of the comparison. These values are then stored in register logic 425. The outputs from the register logic 425 are 32 error values, which corresponds to the number of bits in each word. In accordance with this example embodiment, the Chien search logic generates 32 error bits per cycle such that after 240 cycles have been performed, 7680 error bits have been produced. With reference again to FIG. 1, these 32-bit error vectors are each XORed with a 32-bit word of the 7680-bit code word by the correction logic 6 in order to invert the bits in the code word that have incorrect values. It should be noted that the present invention has been described with reference to particular embodiments for the purposes of demonstrating the principles and concepts of the present invention. Those skilled in the art will understand that present invention is not limited to these example embodiments. Also, those skilled in the art will understand, in view of the present disclosure, that a variety of logical configurations can be used to achieve the goals of the present invention. It should also be noted that although the present invention has been described herein as being performed in hardware in an IC (e.g., an application specific integrated circuit (IC)), the present invention may be implemented in hardware, in a combination of hardware and software, in a microprocessor, in a field programmable gate array, etc. Those skilled in the art will understand the way in which the tasks discussed herein can be performed by a variety of such physical implementations. Those skilled in the art will understand that a variety of changes can be made to the configurations described herein and shown in the figures, and that all such modifications are within the scope of the present invention.

What is claimed is:

1. An apparatus for locating errors in an error locator polynomial in a decoder of a forward error correction (FEC) system, the apparatus comprising:

Chien search algorithm logic configured to receive error locator coefficients of an error locator polynomial and to process the received coefficients to produce an error vector, the Chien search algorithm logic comprising:

scaling logic configured to scale each of the received coefficients of the error locator polynomial with particular respective scaling value;

coefficient storage logic configured to store the scaled coefficients of the error locator polynomial; and matrix multiply logic configured to multiply Chien search matrix coefficients by the scaled coefficients to produce the error location values, the matrix multiply logic using a partial Chien search matrix and matrix coefficients having constant values.

2. The apparatus of claim 1, wherein the Chien search algorithm logic further comprises:

compare logic configured to compare the error location values with a binary compare value to determine and to output an error vector value that has a binary logic value that depends on results of the compare operation.

3. The apparatus of claim 2, wherein the Chien search algorithm logic further comprises:

error vector storage logic configured to store error vector values output from the compare logic.

4. The apparatus of claim 1, wherein the scaling logic is configured to scale the received coefficients simultaneously by using parallel binary multiply and add logic to perform the scaling operations in parallel.

5. The apparatus of claim 1, wherein the matrix multiply logic is configured to simultaneously multiply the Chien search matrix coefficients by the scaled coefficients to simultaneously produce the error location values, the matrix multiply logic using parallel binary multiply and add logic to simultaneously generate the locator values.

6. The apparatus of claim 3, further comprising:

error correction logic configured to receive an error vector from the error vector storage logic and a data word of a code word and to exclusive-OR respective bits of the error locator vector with respective bits of the data word in order to correct any bit errors in the data word.

7. The apparatus of claim 6, wherein the Chien search logic is capable of correcting any bit errors in a code word that is 7680 bits in width in 240 system clock cycles or less.

8. The apparatus of claim 3, wherein the apparatus operates on code words that are encoded using block coding in such a way that the decoder has an error correction capability of at least 39 for a code word that is 7680 bits in width.

9. The apparatus of claim 8, wherein the block coding is Bose-Chaudhuri-Hocquenghem (BCH) block coding.

10. A method for locating errors in an error locator polynomial in a decoder of a forward error correction (FEC) system, the method comprising:

receiving error locator coefficients of an error locator polynomial in Chien search algorithm logic configured to process the received coefficients to produce an error vector, the Chien search algorithm performing the steps of:

scaling each of the received coefficients of the error locator polynomial with particular respective scaling value;

storing the scaled coefficients of the error locator polynomial in coefficient storage logic; and multiplying Chien search matrix coefficients by the scaled coefficients matrix multiply to produce error location values using a partial Chien search matrix and matrix coefficients that have constant values.

11. The method of claim 10, further comprising the step of:

comparing the error location values with a binary compare value in compare logic and outputting an error vector value from the compare logic that has a binary logic value that depends on results of the compare operation.

12. The method of claim 11, further comprising the step of:

storing error vector values output from the compare logic in error vector storage logic.

13. The method of claim 10, wherein the scaling step is performed in scaling logic is configured to scale the received coefficients simultaneously by using parallel binary multiply and add logic to perform the scaling operations in parallel.

14. The method of claim 10, wherein the matrix multiplying step is performed in matrix multiply logic configured to simultaneously multiply the Chien search matrix coefficients by the scaled coefficients to simultaneously produce the locator values, the matrix multiply logic using parallel binary multiply and add logic to simultaneously generate the locator values.

15. The method of claim 12, further comprising the step of:

receiving an error vector output from the error vector storage logic and a data word of a code word in error correction logic configured to exclusive-OR respective bits of the error locator vector with respective bits of the data word in order to correct any bit errors in the data word.

16. The method of claim 15, wherein any bit errors in a code word that is 7680 bits in width or greater can be corrected in 240 system clock cycles or less.

17. The method of claim 13, wherein the decoder has an error correction capability of at least 39 for a code word that is 7680 bits in width.

18. The method of claim 16, wherein Bose-Chaudhuri-Hocquenghem (BCH) block coding is used to encode each code word.

19. A computer program for locating errors in an error locator polynomial in a decoder of a forward error correction (FEC) system, the program being embodied on a computer-readable medium, the program comprising:

a first code segment for processing error locator coefficients of an error locator polynomial in accordance with a Chien search algorithm to produce an error vector;

a second code segment for scaling each of the received coefficients of the error locator polynomial with particular respective scaling value;

a third code segment for storing the scaled coefficients of the error locator polynomial in coefficient storage logic; and a fourth code segment for multiplying Chien search matrix coefficients by the scaled coefficients matrix multiply to produce locator values using a partial Chien search matrix and matrix coefficients that have constant values.

20. The computer program of claim 19, further comprising:

a fifth code segment for comparing the locator values with a binary compare value in compare logic and outputting an error vector value from the compare logic that has a binary logic value that depends on results of the compare operation.

* * * * *